United States Patent
Yoon et al.

(10) Patent No.: US 11,281,882 B2
(45) Date of Patent: Mar. 22, 2022

(54) DISPLAY APPARATUS AND METHOD OF MANUFACTURING THE SAME

(71) Applicant: Samsung Display Co., Ltd., Yongin-si (KR)

(72) Inventors: Ju-won Yoon, Suwon-si (KR); Moosoon Ko, Seoul (KR); Youngwoo Park, Yongin-si (KR); Seongjun Lee, Seoul (KR)

(73) Assignee: Samsung Display Co., Ltd., Yongin-si (KR)

( * ) Notice: Subject to any disclaimer, the term of this patent is extended or adjusted under 35 U.S.C. 154(b) by 0 days.

(21) Appl. No.: 17/213,127

(22) Filed: Mar. 25, 2021

(65) Prior Publication Data

US 2021/0216738 A1 Jul. 15, 2021

Related U.S. Application Data

(62) Division of application No. 15/961,513, filed on Apr. 24, 2018, now Pat. No. 10,977,471.

(30) Foreign Application Priority Data

Apr. 28, 2017 (KR) .......................... 10-2017-0055485

(51) Int. Cl.
 *H01L 27/12* (2006.01)
 *G06K 9/00* (2022.01)

(52) U.S. Cl.
 CPC ........ *G06K 9/0002* (2013.01); *H01L 27/1255* (2013.01); *H01L 27/1259* (2013.01); *G06F 2203/04103* (2013.01)

(58) Field of Classification Search
 CPC ............. H01L 27/1255; H01L 27/1259; G06F 2203/04103
 See application file for complete search history.

(56) References Cited

U.S. PATENT DOCUMENTS

| 7,342,615 | B2 | 3/2008 | Toyota et al. |
| 10,025,970 | B2 | 7/2018 | Mizuhashi et al. |

(Continued)

FOREIGN PATENT DOCUMENTS

| KR | 10-0873497 | 12/2008 |
| KR | 100896565 | 5/2009 |

(Continued)

OTHER PUBLICATIONS

Non-Final Office Action dated Sep. 4, 2020, in U.S. Appl. No. 15/961,513.

(Continued)

*Primary Examiner* — Michael Pervan
(74) *Attorney, Agent, or Firm* — H.C. Park & Associates, PLC

(57) ABSTRACT

A method of manufacturing a display apparatus includes: forming first patterns of a semiconductor material on a base layer; forming a first insulating layer covering the first patterns; forming second patterns of a conductive material on the first insulating layer; removing at least a portion of at least one of the second patterns; and forming a second insulating layer on the second patterns. Each of the second patterns includes a first layer and a second layer disposed on the first layer, the first patterns include a semiconductor pattern, the second patterns include a control electrode pattern overlapping with the semiconductor pattern in a plan view and a sensing electrode pattern, the second layer of the control electrode pattern fully covers the first layer of the control electrode pattern, and the second layer of the sensing electrode pattern is partially removed in the removing of the at least a portion to partially cover the first layer of the sensing electrode pattern.

3 Claims, 23 Drawing Sheets

(56) References Cited

U.S. PATENT DOCUMENTS

| | | |
|---|---|---|
| 2006/0017862 A1 | 1/2006 | Song et al. |
| 2012/0062487 A1 | 3/2012 | Lee et al. |
| 2013/0287274 A1 | 10/2013 | Shi et al. |
| 2014/0333328 A1 | 11/2014 | Nelson et al. |
| 2016/0098140 A1 | 4/2016 | Lee et al. |
| 2016/0350571 A1 | 12/2016 | Han et al. |
| 2017/0103247 A1 | 4/2017 | Mizuhashi et al. |
| 2017/0317085 A1 | 11/2017 | Kurokawa |

FOREIGN PATENT DOCUMENTS

| | | |
|---|---|---|
| KR | 10-2016-0033328 | 3/2016 |
| KR | 10-1691619 | 1/2017 |
| KR | 10-2017-0042475 | 4/2017 |

OTHER PUBLICATIONS

Notice of Allowance dated Dec. 18, 2020, in U.S. Appl. No. 15/961,513.

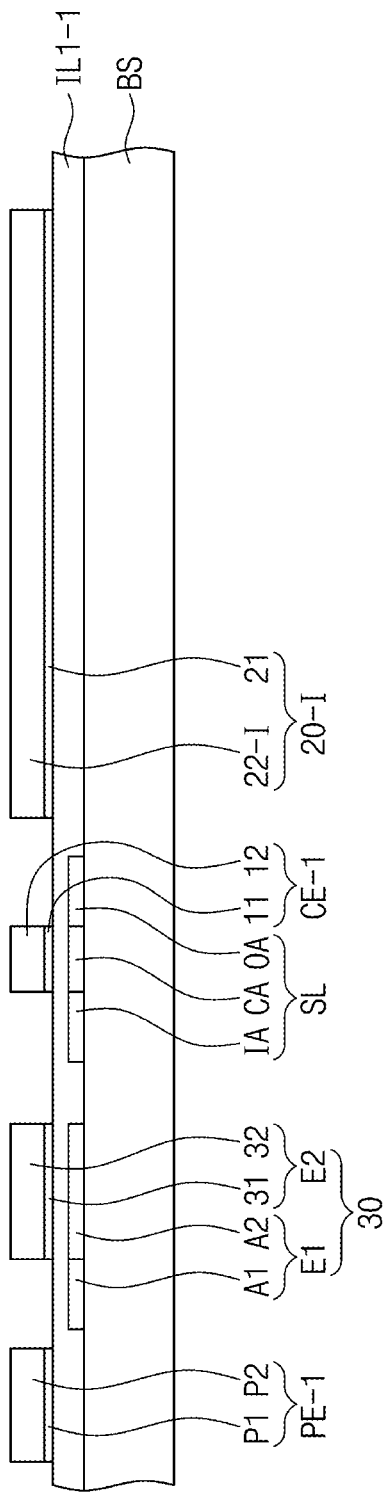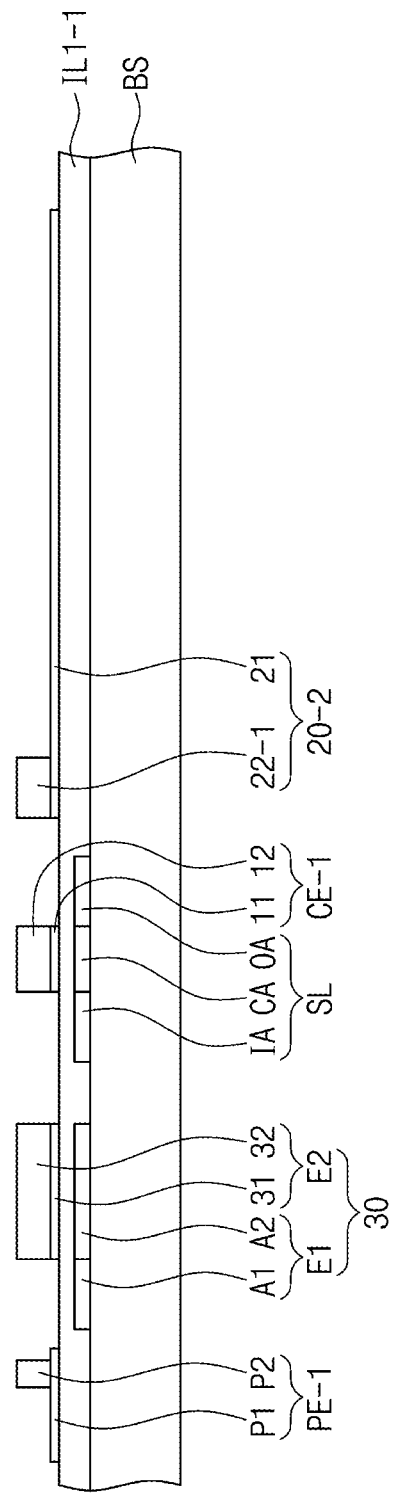

DISPLAY APPARATUS AND METHOD OF MANUFACTURING THE SAME

CROSS REFERENCE TO RELATED APPLICATION

This application is a Division of U.S. patent application Ser. No. 15/961,513 filed on Apr. 24, 2018, which claims priority from and the benefit of Korean Patent Application No. 10-2017-0055485, filed on Apr. 28, 2017, each of which is hereby incorporated by reference for all purposes as if fully set forth herein.

BACKGROUND

Field

Embodiments of the invention relate to a display apparatus and a method of manufacturing the same and, more particularly, to a display apparatus including an active matrix sensor and a method of manufacturing the same.

Discussion of the Background

Various display apparatuses used in multimedia devices such as televisions, portable phones, tablet computers, navigation systems, and game consoles have been developed.

Recently, a function for sensing a fingerprint of a user has been incorporated into display apparatuses. Fingerprint recognition methods may include a capacitive method based on a change in capacitance between electrodes, an optical method using an optical sensor, and an ultrasonic method using a piezoelectric body.

The above information disclosed in this Background section is only for understanding of the background of the inventive concepts, and, therefore, it may contain information that does not constitute prior art.

SUMMARY

Embodiments of the invention may provide a display apparatus including an active matrix type fingerprint sensor, which is capable of simplifying processes.

In an embodiment, a display apparatus includes a display panel, a thin film transistor including a control electrode disposed on a surface of the display panel, a semiconductor pattern overlapping with the control electrode in a plan view, an input electrode connected to a portion of the semiconductor pattern, and an output electrode connected to another portion of the semiconductor pattern, a first insulating layer disposed between the control electrode and the semiconductor pattern, a second insulating layer covering the input electrode and the output electrode, and a sensing electrode disposed between the display panel and the second insulating layer.

The control electrode may be disposed under the semiconductor pattern, and the control electrode and the sensing electrode may be disposed between the display panel and the first insulating layer.

The control electrode may be disposed on the semiconductor pattern, and the control electrode and the sensing electrode may be disposed between the first insulating layer and the second insulating layer.

Each of the sensing electrode and the control electrode may include a first layer, and a second layer disposed on the first layer. The first layer of the control electrode may be fully covered by the second layer of the control electrode, and the first layer of the sensing electrode may be partially covered by the second layer of the sensing electrode.

The first layers may be optically transparent.

Electrical conductivities of the second layers may be higher than those of the first layers.

The display apparatus according to an embodiment may further include a third insulating layer disposed between the first insulating layer and the second insulating layer. The input electrode and the output electrode may be disposed on the third insulating layer. An opening may be defined in the third insulating layer. The opening may overlap with a portion of the first layer of the sensing electrode, which is exposed by the second layer of the sensing electrode.

The display apparatus according to an embodiment may further include a capacitor including a first electrode disposed on a same layer as the control electrode, and a second electrode disposed on a same layer as the semiconductor pattern. The capacitor may be electrically connected to the thin film transistor and the sensing electrode.

The first electrode may include a same material as the control electrode, and the second electrode may include a same material as the semiconductor pattern.

The display apparatus according to an embodiment may further include a third insulating layer covering the control electrode and disposed between the first insulating layer and the second insulating layer, and a plurality of patterns disposed on the third insulating layer. The input electrode and the output electrode may be disposed on the third insulating layer. The plurality of patterns may include a first pattern penetrating the third insulating layer so as to be connected to the control electrode, a second pattern penetrating the third insulating layer so as to be connected to the sensing electrode, and a third pattern penetrating the third insulating layer so as to be connected to the capacitor.

The plurality of patterns may further include a fourth pattern receiving a driving voltage from an outside. The fourth pattern may receive the driving voltage from the outside through an opening penetrating the second insulating layer.

The display apparatus may further include a fourth pattern disposed on a same layer as the control electrode and receiving a driving voltage from an outside. The fourth pattern may receive the driving voltage from the outside through an opening penetrating the second insulating layer and the third insulating layer.

In another embodiment, a method of manufacturing a display apparatus includes forming first patterns of a semiconductor material on a base layer, forming a first insulating layer covering the first patterns, forming second patterns of a conductive material on the first insulating layer, removing at least a portion of at least one of the second patterns, and forming a second insulating layer on the second patterns. Each of the second patterns may include a first layer, and a second layer disposed on the first layer, and the first patterns may include a semiconductor pattern. The second patterns may include a control electrode pattern overlapping with the semiconductor pattern in a plan view, and a sensing electrode pattern. The second layer of the control electrode pattern may fully cover the first layer of the control electrode pattern, and the second layer of the sensing electrode pattern may be partially removed in the removing of the at least a portion to partially cover the first layer of the sensing electrode pattern.

The forming the second insulating layer may include forming an insulating material layer covering the second patterns, and forming an opening exposing at least a portion of the sensing electrode pattern in the insulating material layer to form the second insulating layer. A portion of the second layer of the sensing electrode pattern, which corresponds to the opening of the second insulating layer, may be removed.

The forming the second insulating layer may include forming an insulating material layer covering the second patterns, and forming an opening exposing at least a portion of the sensing electrode pattern in the insulating material layer to form the second insulating layer. The forming of the opening may be performed after the portion of the second layer of the sensing electrode pattern is removed.

In still another embodiment, a display apparatus may include a display member including a plurality of light-emitting areas, and a sensing member including a plurality of unit sensors corresponding to the light-emitting areas, respectively. Each of the plurality of unit sensors may include a thin film transistor including a control electrode, a semiconductor pattern overlapping with the control electrode in a plan view, an input electrode connected to a portion of the semiconductor pattern, and an output electrode connected to another portion of the semiconductor pattern, a sensing electrode electrically connected to the thin film transistor and disposed on a same layer as the control electrode, and a dielectric layer disposed on the sensing electrode.

Each of the sensing electrode and the control electrode may include a first layer that is optically transparent, and a second layer disposed on the first layer and having an electrical conductivity higher than that of the first layer. The first layer of the control electrode may be fully covered by the second layer of the control electrode, and the first layer of the sensing electrode may be partially covered by the second layer of the sensing electrode.

The sensing electrode may overlap with the light-emitting area.

The display apparatus may further include a capacitor element including a first electrode disposed on a same layer as the semiconductor pattern and including a same material as the semiconductor pattern, and a second electrode disposed on the same layer as the control electrode and including a same material as the control electrode.

Additional features of the inventive concepts will be set forth in the description which follows, and in part will be apparent from the description, or may be learned by practice of the inventive concepts.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the inventive concepts.

FIGS. 13A, 13B, 13C, 13D, and 13E are cross-sectional views illustrating a method of manufacturing an electronic apparatus, according to an embodiment of the invention.

DETAILED DESCRIPTION

Figure 1:
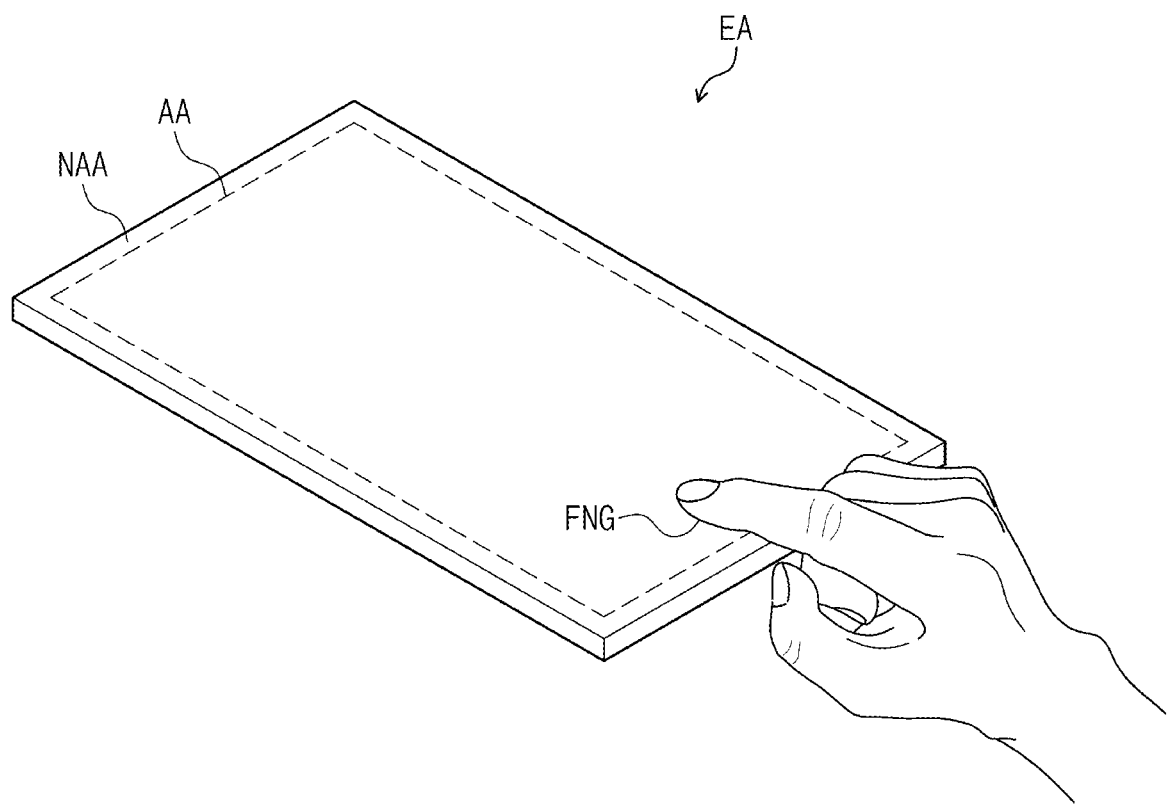
FIG. 1 is a perspective view illustrating an electronic apparatus according to an embodiment of the invention.

In the following description, for the purposes of explanation, numerous specific details are set forth in order to provide a thorough understanding of various embodiments or implementations of the invention. As used herein "embodiments" and "implementations" are interchangeable words that are non-limiting examples of devices or methods employing one or more of the inventive concepts disclosed herein. It is apparent, however, that various embodiments may be practiced without these specific details or with one or more equivalent arrangements. In other instances, well-known structures and devices are shown in block diagram form in order to avoid unnecessarily obscuring various embodiments. Further, various embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 2A:
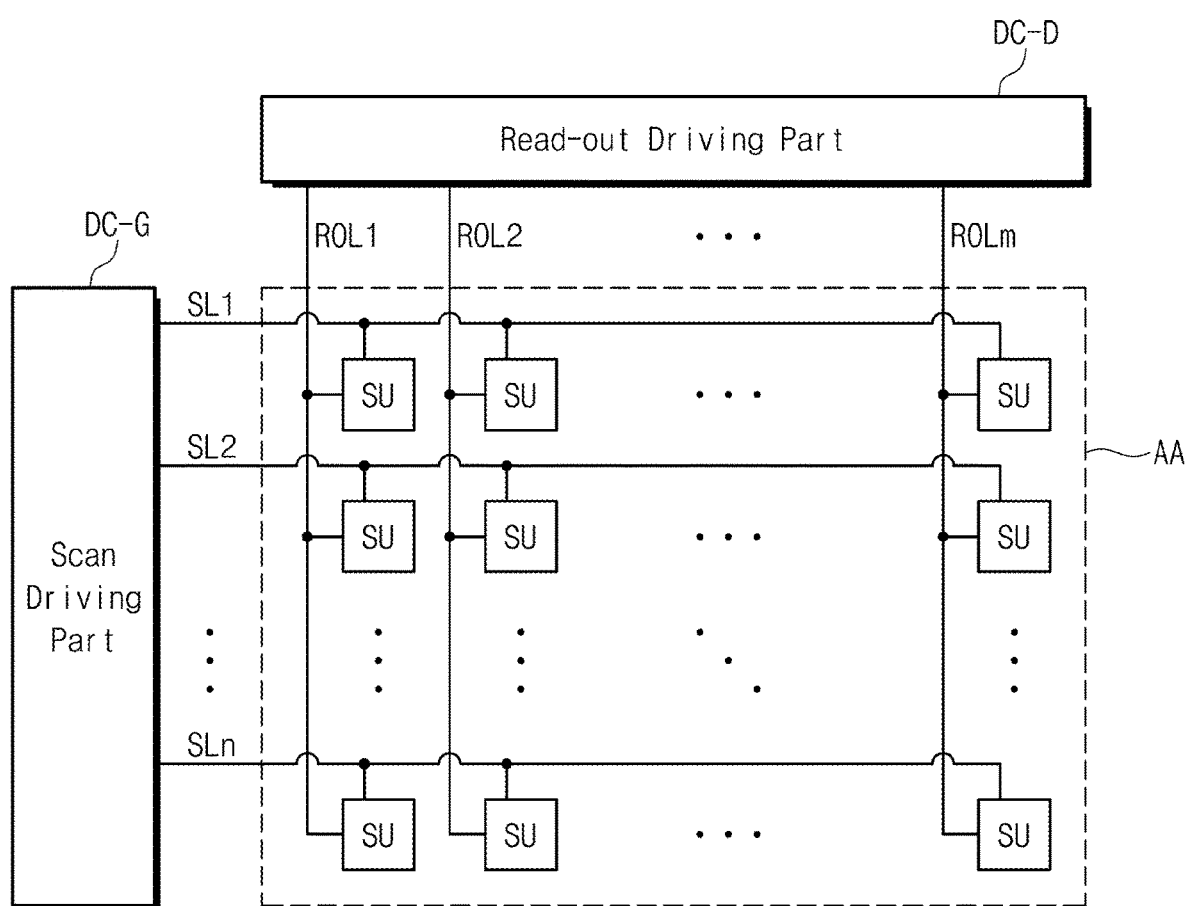
FIG. 2A is a block diagram of the electronic apparatus illustrated in FIG. 1.
Figure 2B:
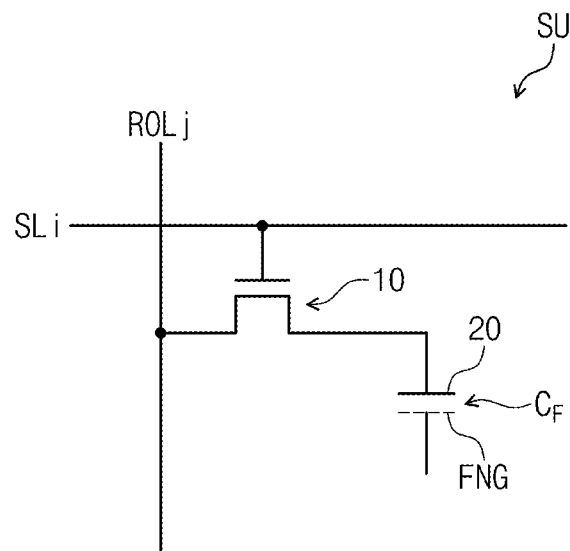
FIG. 2B is an equivalent circuit diagram illustrating a portion of the electronic apparatus of FIG. 2A.
Figure 3:
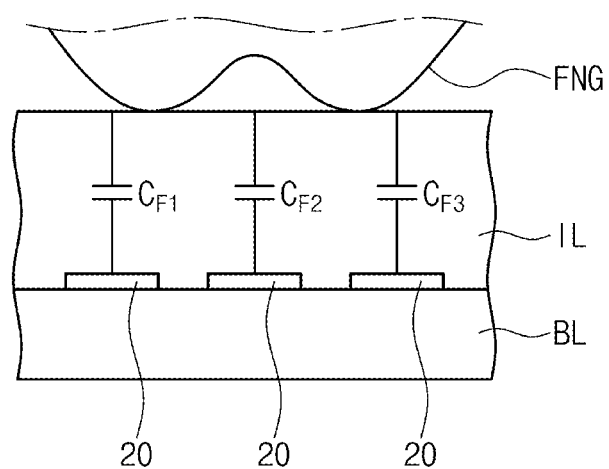
FIG. 3 is a cross-sectional view schematically illustrating a portion of the electronic apparatus of FIG. 1.

FIG. 1 is a perspective view illustrating an electronic apparatus according to an embodiment of the invention. FIG. 2A is a block diagram of the electronic apparatus illustrated in FIG. 1. FIG. 2B is an equivalent circuit diagram illustrating a portion of the electronic apparatus of FIG. 2A. FIG. 3 is a cross-sectional view schematically illustrating a portion of the electronic apparatus of FIG. 1. Hereinafter, an electronic apparatus EA according to an embodiment of the invention will be described with reference to FIGS. 1, 2A, 2B, and 3.

The electronic apparatus EA may be driven by an electrical signal. As illustrated in FIG. 1, the electronic apparatus EA may include an active area AA and a peripheral area NAA 20 when viewed in a plan view.

The active area AA may be an area that is activated by an electrical signal. In the illustrated embodiment, the active area AA may be an area that senses external input FNG provided from the outside when the electrical signal is applied thereto.

The external input FNG may be provided in various forms. For example, the external input FNG may include a touch, light, and/or pressure. The touch may include a proximity touch and a direct touch. The external input FNG may be provided in various forms, depending on a purpose of the electronic apparatus EA.

In the illustrated embodiment, the electronic apparatus EA may be a fingerprint sensing apparatus. Thus, the external input FNG may be a direct touch of a user. However, this is an example of the invention, and the electronic apparatus EA may be applied to other various embodiments capable of sensing other various kinds of the external inputs FNG. In other words, the invention is not limited to a specific embodiment.

The peripheral area NAA is adjacent to the active area AA. Signal lines and/or driving elements for transmitting electrical signals to the active area AA may be disposed in the peripheral area NAA.

In the illustrated embodiment, the peripheral area NAA has a frame shape that surrounds the active area AA in a plan view. However, embodiments of the invention are not limited thereto. In other embodiments, the shape of the peripheral area NAA may be variously modified, or the peripheral area NAA may be omitted.

The electronic apparatus EA according to the invention may be an active matrix type sensing member. In more detail, referring to FIGS. 2A and 2B, the electronic apparatus EA may include a scan driving part DC-G, a read-out driving part DC-D, and a plurality of unit sensors SU. The unit sensors SU may be arranged in a matrix form in the active area AA. The plurality of unit sensors SU may be connected to the scan driving part DC-G through a plurality of scan driving lines SL1 to SLn and may be connected to the read-out driving part DC-D through a plurality of read-out lines ROL1 to ROLm.

The scan driving part DC-G may sequentially drive the scan driving lines SL1 to SLn. Thus, the unit sensors SU may provide or generate sensing signals independently.

The read-out driving part DC-D may receive the sensing signals including information on the external input FNG from the unit sensors SU through the read-out lines ROL1 to ROLm.

The unit sensors SU may recognize a fingerprint applied from the outside. In more detail, the unit sensors SU may recognize fingerprint information on a fingerprint of a user applied from the outside.

The unit sensors SU may recognize a fingerprint of a user, applied to an outer surface of the electronic apparatus EA, by a capacitive method. The unit sensors SU may obtain the fingerprint information by a self-capacitance method or a mutual capacitance method.

FIG. 2B schematically illustrates an equivalent circuit diagram of one unit sensor SU connected to one scan driving line SLi and one read-out line ROLj. Referring to FIG. 2B, the unit sensor SU may include a thin film transistor 10 and a sensing electrode 20.

The thin film transistor 10 may control activation of the sensing electrode 20 by an electrical signal applied from the scan driving line SLi. The sensing electrode 20 may form a capacitance CF with the external input FNG applied from the outside. When the thin film transistor 10 is turned-on, a voltage of the sensing electrode 20 may be measured through the read-out line ROLj to sense a shape of the external input FNG.

Referring to FIG. 3, an embodiment in which the electronic apparatus EA obtains the fingerprint information by the self-capacitance method is illustrated as an example. In more detail, the electronic apparatus EA may include a base layer BL, a plurality of sensing electrodes 20, and an insulating layer IL. A top surface of the insulating layer IL may correspond to the outer surface of the electronic apparatus EA.

When a fingerprint of a user is provided as the external input FNG to the top surface of the insulating layer IL, the sensing electrodes 20 may form different capacitances $C_{F1}$, $C_{F2}$ and $C_{F3}$ from each other with respect to ridges and valleys of the external input FNG. The unit sensors SU may recognize a shape of the external input FNG (i.e., fingerprint information of a user) by using a capacitance difference depending on a distance between the ridge and the valley of the external input FNG. However, embodiments of the invention are not limited thereto. In another embodiment, the unit sensors SU may have structures capable of obtaining information of the external input FNG by the mutual capacitance method.

In the illustrated embodiment, sensing areas may correspond to the sensing electrodes 20, respectively. Thus, sizes of the sensing electrodes 20 and/or a distance between the sensing electrodes 20 may be smaller than a distance between the ridge and valley of the fingerprint. A fingerprint sensing characteristic in the active area AA may be more improved as the sizes of the sensing electrodes 20 and/or the distance between the sensing electrodes 20 decrease. However, embodiments of the invention are not limited thereto. In other embodiments, the size of the sensing electrode 20 may be variously changed depending on the function of the electronic apparatus EA.

Figure 4:
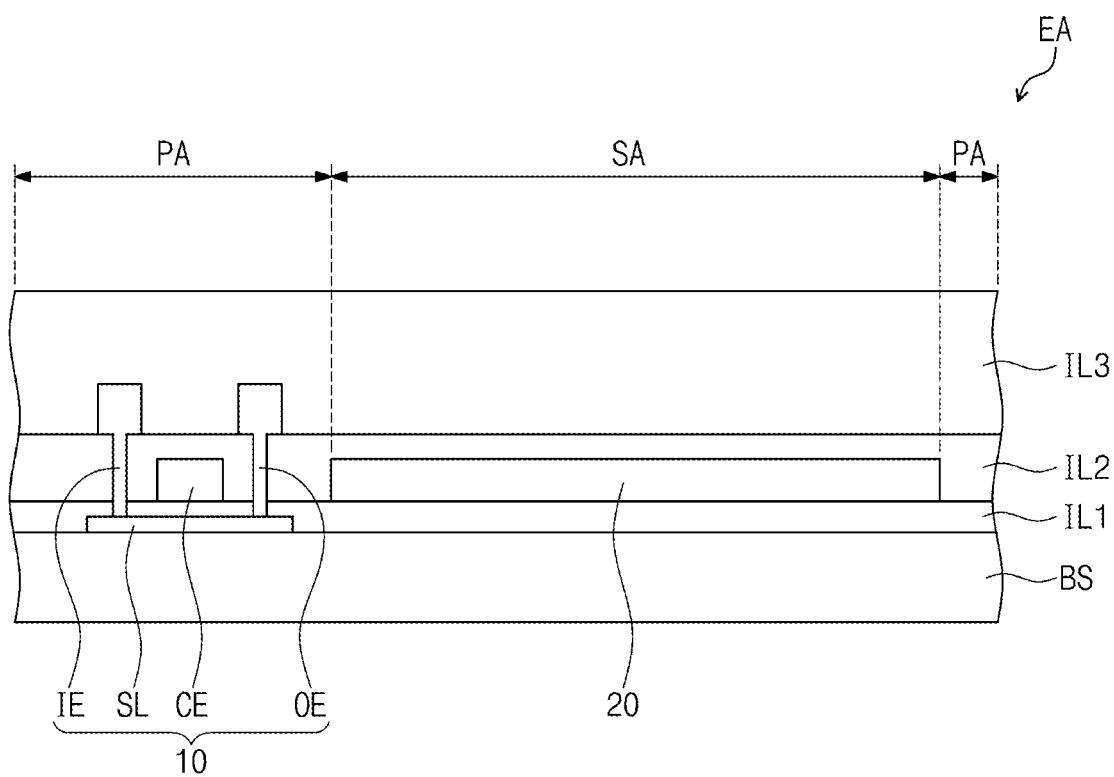
FIG. 4 is a cross-sectional view illustrating a portion of an electronic apparatus according to an embodiment of the invention.

FIG. 4 is a cross-sectional view illustrating a portion of an electronic apparatus according to an embodiment of the invention. FIG. 4 illustrates a cross-sectional view of one unit sensor illustrated in FIG. 2B for the purpose of ease and convenience in description and illustration.

Referring to FIG. 4, an electronic apparatus EA includes a base layer BS, a thin film transistor 10, a sensing electrode 20, and a plurality of insulating layers IL1, IL2 and IL3. The base layer BS may be a base layer on which the thin film transistor 10, the sensing electrode 20 and the plurality of insulating layers IL1, IL2 and IL3 are disposed.

The base layer BS may include an insulating material. In some embodiments, the base layer BS may be an insulating substrate, an insulating film, or an insulating thin layer. Alternatively, in other embodiments, the base layer BS may be an insulating layer including an inorganic thin layer, an organic thin layer, or a stack structure of at least one inorganic layer and/or at least one organic layer.

The thin film transistor 10 is disposed on the base layer BS. The thin film transistor 10 includes a semiconductor pattern SL, a control electrode CE, an input electrode IE, and an output electrode OE.

The semiconductor pattern SL may be disposed between a first insulating layer IL1 and the base layer BS. The semiconductor pattern SL includes a semiconductor material.

The control electrode CE is disposed on the semiconductor pattern SL. The control electrode CE may be disposed between the first insulating layer IL1 and a second insulating layer IL2. The control electrode CE may overlap with at least a portion of the semiconductor pattern SL when viewed in a plan view.

Even though not indicated by a reference designator, the semiconductor pattern SL may include a channel area overlapping with the control electrode CE. The thin film transistor 10 may control a flow of charges generated in the channel area of the semiconductor pattern SL to easily control driving of other electronic elements connected to the thin film transistor 10.

The input electrode IE and the output electrode OE may be disposed between the second insulating layer IL2 and a third insulating layer IL3. The input electrode IE and the output electrode OE may be spaced apart from each other when viewed in a plan view.

Each of the input electrode IE and the output electrode OE may penetrate the second insulating layer IL2 and the first insulating layer IL1 so as to be connected to the semiconductor pattern SL. In more detail, the input electrode IE may be connected to a first portion of the semiconductor pattern SL, and the output electrode OE may be connected to a second portion of the semiconductor pattern SL. The first portion and the second portion of the semiconductor pattern SL may be spaced apart from each other with the channel area interposed therebetween.

The sensing electrode 20 may be disposed on the same layer as the control electrode CE. In more detail, the sensing electrode 20 may be disposed between the first insulating layer IL1 and the second insulating layer IL2. The sensing electrode 20 is laterally spaced apart from the control electrode CE in a plan view. The third insulating layer IL3 may be disposed on the thin film transistor 10 and the sensing electrode 20 to overlap with both the thin film transistor 10 and the sensing electrode 20.

The sensing electrode 20 may include the same material as the control electrode CE. For example, the sensing electrode 20 may include at least one of a metal, a conductive oxide, a conductive polymer, or a conductive nanostructure.

The sensing electrode 20 may be electrically connected to the thin film transistor 10. The sensing electrode 20 may be connected to the thin film transistor 10 through an interconnection line (not shown). The sensing electrode 20 may be provided with an electrical signal from the thin film transistor 10.

The electronic apparatus EA may include a sensing area SA and an element area PA in a plan view. The sensing area SA may be an area in which the sensing electrode 20 is disposed.

The sensing electrode 20 and the external input FNG (see FIG. 1) being in contact with the sensing area SA may form a capacitor with the second and third insulating layers IL2 and IL3 interposed therebetween. The electronic apparatus EA may sense a shape of the external input FNG provided to the sensing area SA by an electrical signal outputted from the sensing electrode 20. Thus, the electronic apparatus EA may easily sense fingerprint information of a user through an entire surface of the active area AA (see FIG. 1).

Figure 5:
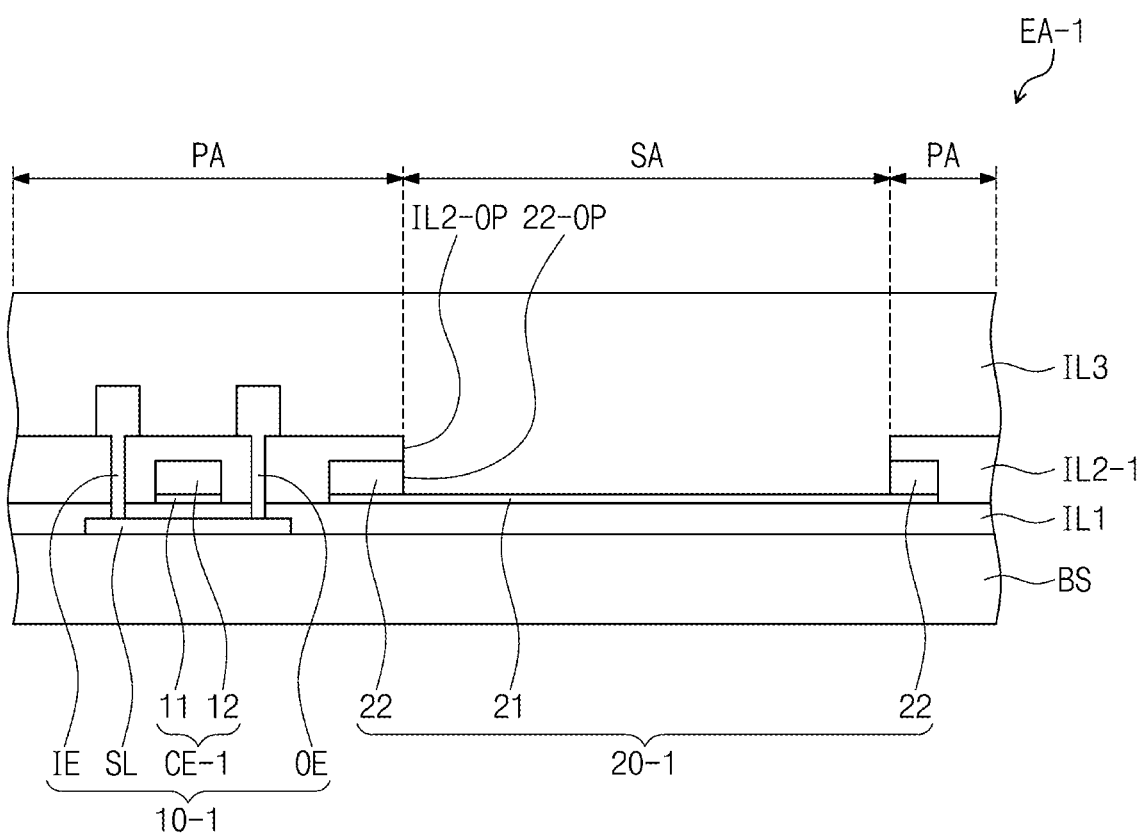
FIG. 5 is a cross-sectional view illustrating a portion of an electronic apparatus according to an embodiment of the invention.

FIG. 5 is a cross-sectional view illustrating a portion of an electronic apparatus according to an embodiment of the invention. FIG. 5 illustrates an area corresponding to FIG. 4. Hereinafter, an electronic apparatus EA-1 according to an embodiment of the invention will be described with reference to FIG. 5. In the illustrated embodiment, the same components as described with reference to FIGS. 1 to 4 will be indicated by the same reference numerals or designators, and the descriptions thereto will be omitted for the purpose of ease and convenience in description and illustration.

Referring to FIG. 5, a thin film transistor 10-1 may include a control electrode CE-1 having a stack structure. The control electrode CE-1 may include a first layer 11 and a second layer 12.

The first layer 11 of the control electrode CE-1 may have electrical conductivity and may be optically transparent. For example, the first layer 11 of the control electrode CE-1 may include a transparent conductive oxide (TCO), a metal nanowire, a metal nanoparticle, or a conductive polymer.

The second layer 12 of the control electrode CE-1 may have electrical conductivity and may have a low internal resistance. The second layer 12 of the control electrode CE-1 may include a material of which an electrical conductivity is higher than that of the first layer 11 of the control electrode CE-1. For example, the second layer 12 of the control electrode CE-1 may include a metal having a high electrical conductivity, such as copper or a copper alloy.

A sensing electrode 20-1 is disposed on the same layer as the control electrode CE-1. The sensing electrode 20-1 may have a stack structure. The stack structure of the sensing electrode 20-1 may correspond to the stack structure of the control electrode CE-1. Thus, the sensing electrode 20-1 and the control electrode CE-1 may be patterned at the same time.

In more detail, the sensing electrode 20-1 may include a first layer 21 and a second layer 22. The first layer 21 of the sensing electrode 20-1 may be optically transparent. The first layer 21 of the sensing electrode 20-1 may include the same material as the first layer 11 of the control electrode CE-1.

The second layer 22 of the sensing electrode 20-1 may include a material of which an electrical conductivity is higher than that of the first layer 21 of the sensing electrode 20-1. The second layer 22 of the sensing electrode 20-1 may include the same material as the second layer 12 of the control electrode CE-1.

The second layer 12 of the control electrode CE-1 fully covers the first layer 11 of the control electrode CE-1, but the second layer 22 of the sensing electrode 20-1 partially covers the first layer 21 of the sensing electrode 20-1. The first layer 21 of the sensing electrode 20-1 may be exposed through an opening 22-OP defined in the second layer 22 of the sensing electrode 20-1.

A second insulating layer IL2-1 covers at least a portion of the sensing electrode 20-1. An opening IL2-OP corresponding to the opening 22-OP of the second layer 22 of the sensing electrode 20-1 may be defined in the second insulating layer IL2-1.

The opening IL2-OP defined in the second insulating layer IL2-1 overlaps with the opening 22-OP defined in the second layer 22 of the sensing electrode 20-1 when viewed in a plan view. Thus, an inner side surface of the opening 22-OP of the second layer 22 of the sensing electrode 20-1 may be aligned with an inner side surface of the opening IL2-OP of the second insulating layer IL2-1 when viewed in a cross-sectional view.

The third insulating layer IL3 may fill the opening IL2-OP of the second insulating layer IL2-1 and the opening 22-OP of the second layer 22 of the sensing electrode 20-1. The third insulating layer IL3 may be in contact with at least a portion of the sensing electrode 20-1. The third insulating layer IL3 may cover the first layer 21 of the sensing electrode 20-1, which is exposed through the second layer 22 of the sensing electrode 20-1.

Figure 6:
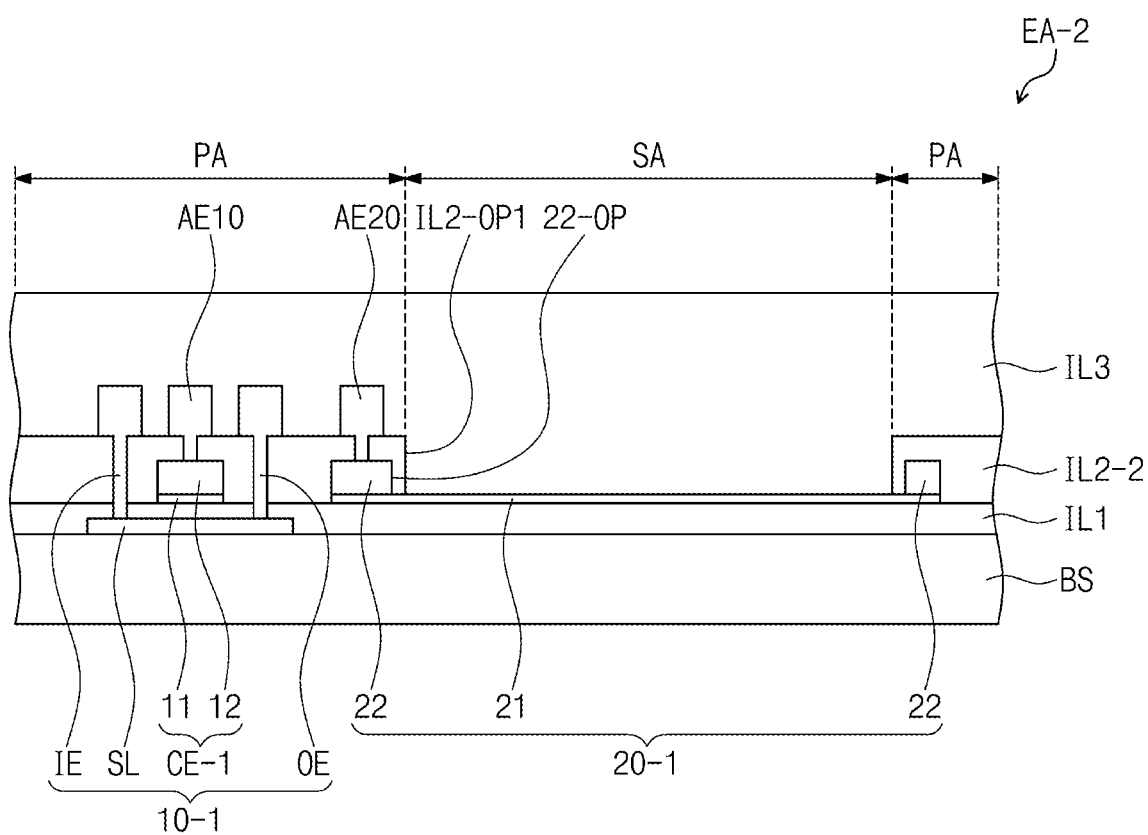
FIG. 6 is a cross-sectional view illustrating a portion of an electronic apparatus according to an embodiment of the invention.

FIG. 6 is a cross-sectional view illustrating a portion of an electronic apparatus according to an embodiment of the invention. FIG. 6 illustrates an area corresponding to the area of FIG. 4 for the purpose of ease and convenience in description. Hereinafter, an electronic apparatus EA-2 according to an embodiment of the invention will be described with reference to FIG. 6. In the illustrated embodiment, the same components as described with reference to FIGS. 1 to 5 will be indicated by the same reference numerals or designators, and the descriptions thereto will be omitted for the purpose of ease and convenience in description and illustration.

Referring to FIG. 6, a second insulating layer IL2-2 may cover the inner side surface of the opening IL2-OP1 defined in the second layer 22 of the sensing electrode 20-1. Thus, a size of an opening IL2-OP1 defined in the second insulating layer IL2-2 may be smaller than a size of the opening 22-OP defined in the second layer 22 of the sensing electrode 20-1 when viewed in a plan view.

At this time, the sensing area SA may be defined to correspond to the opening IL2-OP1 defined in the second insulating layer IL2-2. The electronic apparatus EA-2 may include the third insulating layer IL3 having a uniform thickness in the sensing area SA.

Meanwhile, the electronic apparatus EA-2 may include a plurality of connection electrodes AE10 and AE20. The plurality of connection electrodes AE10 and AE20 may be disposed on the same layer as the input electrode IE and the output electrode OE.

The plurality of connection electrodes AE10 and AE20 may be disposed between the second insulating layer IL2-2 and the third insulating layer IL3. In the illustrated embodiment, the connection electrodes AE10 and AE20 may include a first connection electrode AE10 and a second connection electrode AE20.

The first connection electrode AE10 may be connected to the thin film transistor 10-1. In more detail, the first connection electrode AE10 may penetrate the second insulating layer IL2-2 so as to be connected to the control electrode CE-1. The control electrode CE-1 may receive an electrical signal from the outside through the first connection electrode AE10.

The second connection electrode AE20 may be connected to the sensing electrode 20-1. In more detail, the second connection electrode AE20 may penetrate the second insulating layer IL2-2 so as to be connected to the second layer 22 of the sensing electrode 20-1. The sensing electrode 20-1 may receive/provide an electrical signal from/to the outside through the second connection electrode AE20.

In the illustrated embodiment, the second connection electrode AE20 is connected to the second layer 22 of the sensing electrode 20-1. The second layer 22 has a relatively high conductivity. Thus, a contact resistance between the sensing electrode 20-1 and the second connection electrode AE20 can be reduced to prevent deterioration of electrical characteristics of the sensing electrode 20-1.

Figure 7A:
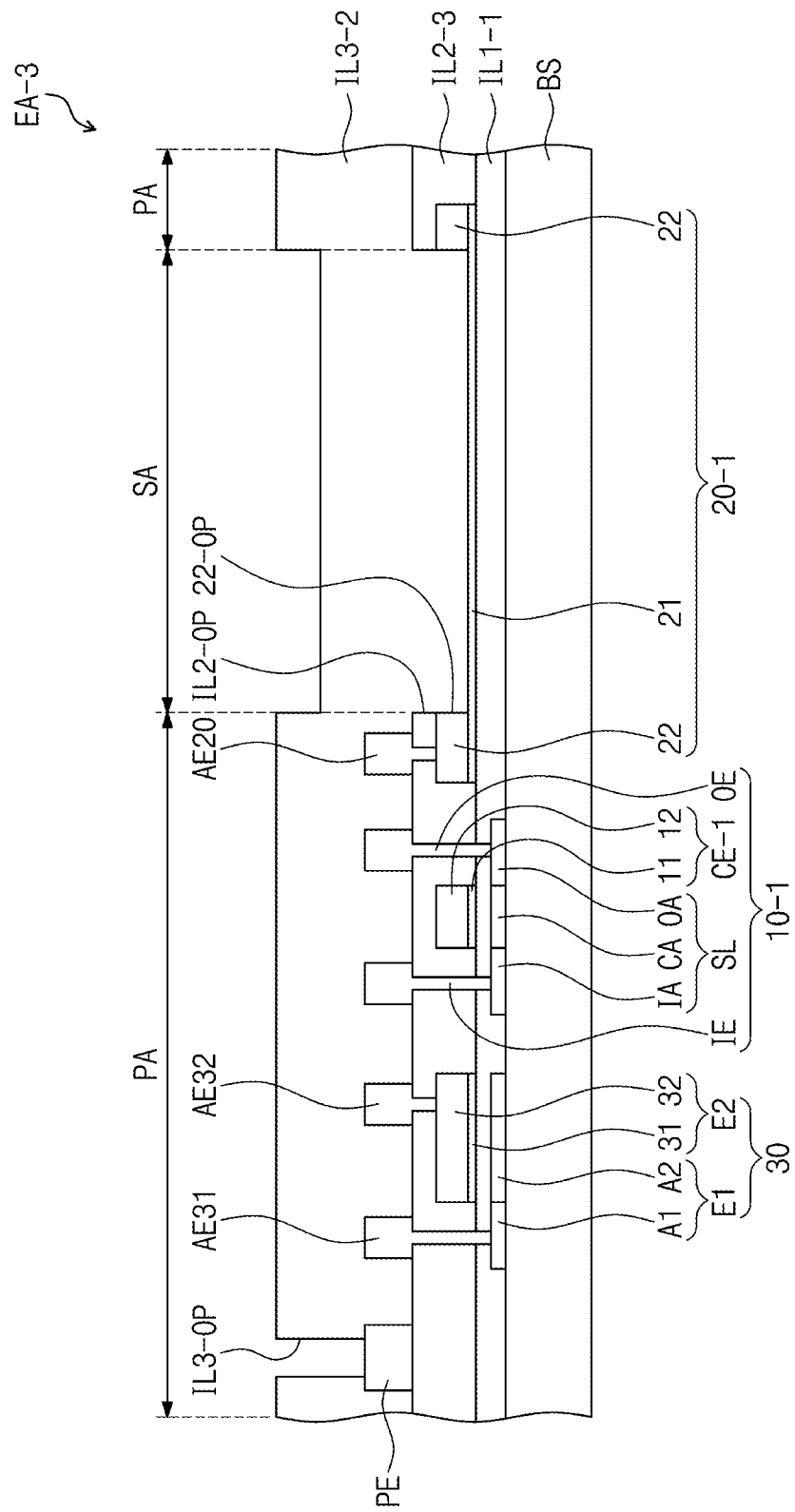
FIGS. 7A, 7B, and 7C are cross-sectional views illustrating portions of electronic apparatuses according to some embodiments of the invention.
Figure 7B:
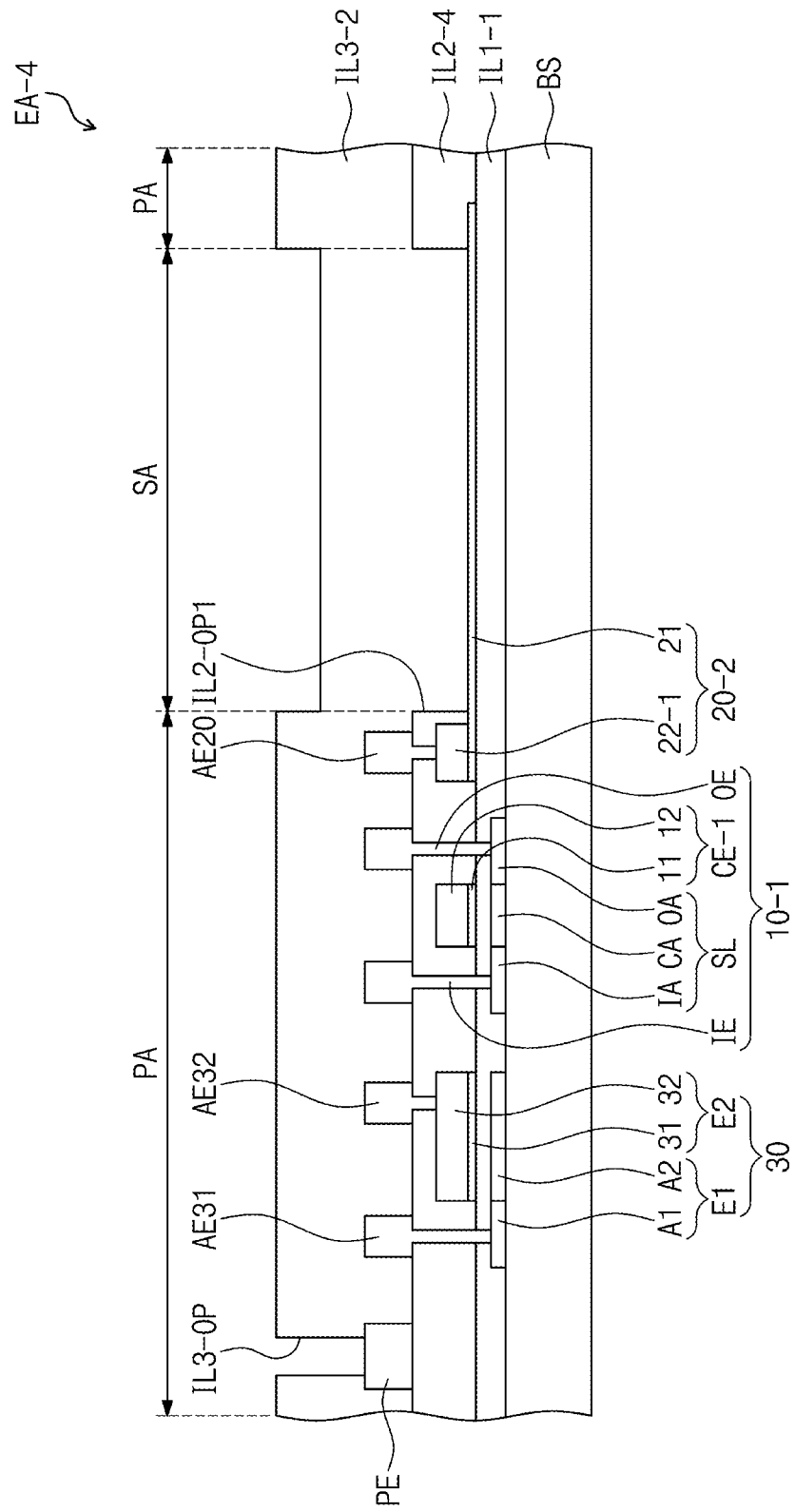
Figure 7C:
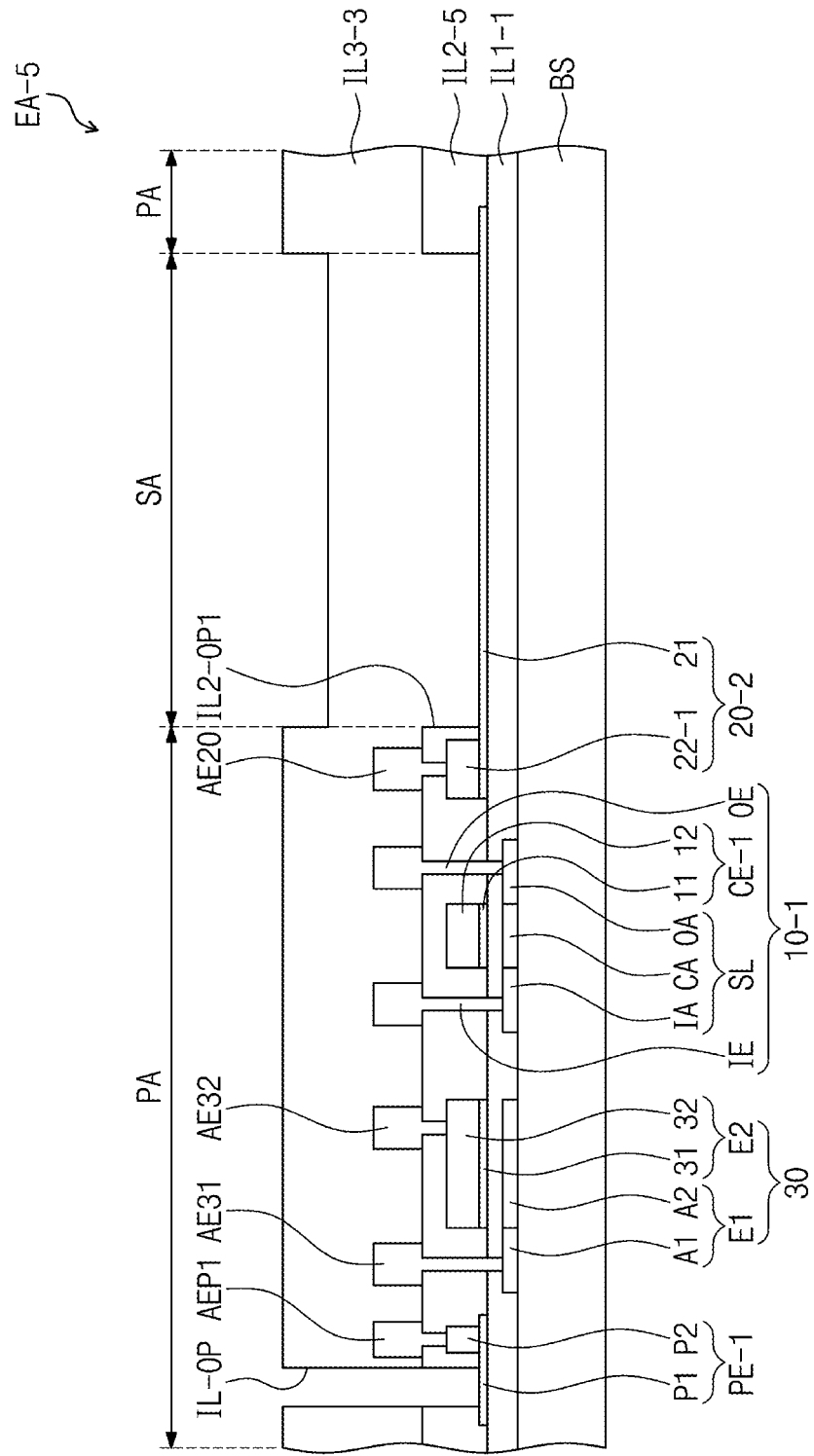

FIGS. 7A to 7C are cross-sectional views illustrating portions of electronic apparatuses according to some embodiments of the invention. FIGS. 7A to 7C illustrate areas corresponding to FIG. 4 for the purpose of ease and convenience in description. Hereinafter, electronic apparatuses EA-3, EA-4 and EA-5 according to some embodiments of the invention will be described with reference to FIGS. 7A to 7C. In these embodiments, the same components as described with reference to FIGS. 1 to 6 will be indicated by the same reference numerals or designators, and the descriptions thereto will be omitted for the purpose of ease and convenience in description and illustration.

Referring to FIG. 7A, the electronic apparatus EA-3 may further include a capacitor element 30. The capacitor element 30 may include a first electrode E1 and a second electrode E2. The first electrode E1 and the second electrode E2 may be spaced apart from each other with a first insulating layer IL1-1 interposed therebetween.

The first electrode E1 is disposed on the same layer as the semiconductor pattern SL. In the illustrated embodiment, the first electrode E1 is disposed between the base layer BS and the first insulating layer IL1-1.

The first electrode E1 may include the same material as the semiconductor pattern SL. Thus, the first electrode E1 and the semiconductor pattern SL may be formed by patterning the same material layer using one mask at the same time.

In more detail, the first electrode E1 may include a semiconductor material. The first electrode E1 may include a first portion A1 and a second portion A2. A conductivity of the first portion A1 may be higher than that of the second portion A2. The second portion A2 may overlap with the second electrode E2 when viewed in a plan view.

The second electrode E2 is disposed on the same layer as the control electrode CE-1. In the illustrated embodiment, the second electrode E2 may be disposed between the first insulating layer IL1-1 and a second insulating layer IL2-3.

The second electrode E2 may include the same material as the control electrode CE-1. The second electrode E2 may have the same structure as the control electrode CE-1. Thus, the control electrode CE-1 and the second electrode E2 may be formed by patterning the same material layer using one mask at the same time.

In more detail, the second electrode E2 may have a stack structure that includes a first layer 31 which is optically transparent and a second layer 32 of which a conductivity is higher than that of the first layer 31. The first layer 31 of the second electrode E2 may include the same material as the first layer 11 of the control electrode CE-1, and the second layer 32 of the second electrode E2 may include the same material as the second layer 12 of the control electrode CE-1.

Meanwhile, the electronic apparatus EA-3 may further include a third connection electrode AE31, a fourth connection electrode AE32, and a pad electrode PE. The third connection electrode AE31, the fourth connection electrode AE32 and the pad electrode PE may be disposed on the same layer as the input electrode IE and the output electrode OE.

In the illustrated embodiment, the third connection electrode AE31, the fourth connection electrode AE32 and the pad electrode PE may be disposed between the second insulating layer IL2-3 and a third insulating layer IL3-2. The third connection electrode AE31 and the fourth connection electrode AE32 are connected to the capacitor element 30.

In more detail, the third connection electrode AE31 penetrates the second insulating layer IL2-3 and the first insulating layer IL1-1 so as to be connected to the first electrode E1. The fourth connection electrode AE32 penetrates the second insulating layer IL2-3 so as to be connected to the second electrode E2. The third connection electrode AE31 and the fourth connection electrode AE32 may provide electrical signals applied from the outside to the first electrode E1 and the second electrode E2, respectively.

The pad electrode PE may directly receive an electrical signal provided from the outside. The electronic apparatus EA-3 may receive the electrical signal from the outside through the pad electrode PE. The pad electrode PE may be exposed outward through an opening IL3-OP defined in the third insulating layer IL3-2. An external electronic device may be connected to the exposed pad electrode PE. Meanwhile, the semiconductor pattern SL may include an input area IA, a channel area CA, and an output area OA. The input area IA and the output area OA are spaced apart from each other with interposing the channel area CA therebetween. And the input area IA and the output area OA may be connected to the input electrode IE and the output electrode OE, respectively.

Other components of the electronic apparatus EA-4 of FIG. 7B except a sensing electrode 20-2 and a second insulating layer IL2-4 may be substantially the same as corresponding components of the electronic apparatus EA-3 of FIG. 7A. As illustrated in FIG. 7B, the sensing electrode 20-2 may include a second layer 22-1 that overlaps with only a portion of a first layer 21 of the sensing electrode 20-2.

Here, the second layer 22-1 of the sensing electrode 20-2 may not include the opening 22-OP illustrated in FIG. 7A. The second layer 22-1 of the sensing electrode 20-2 may be a pattern that has a minimum area necessary to be connected to the second connection electrode AE20.

Thus, an area of a region, exposed from the second layer 22-1, of the first layer 21 of the sensing electrode 20-2 may be greater than an area of an opening IL2-OP defined in the second insulating layer IL2-4. At least a portion of the region, exposed from the second layer 22-1, of the first layer 21 of the sensing electrode 20-2 may be covered by the second insulating layer IL2-4.

Other components of the electronic apparatus EA-5 of FIG. 7C except a pad electrode PE-1 and second and third insulating layers IL2-5 and IL3-3 may be substantially the same as corresponding components of the electronic apparatus EA-4 of FIG. 7B. As illustrated in FIG. 7C, the pad electrode PE-1 may be disposed on the same layer as the control electrode CE-1, the sensing electrode 20-2, and the second electrode E2 of the capacitor element 30.

In the illustrated embodiment, the pad electrode PE-1 may have substantially the same structure as the sensing electrode 20-2. In more detail, the pad electrode PE-1 may include a first layer P1 which is optically transparent, and a second layer P2 of which a conductivity is higher than that of the first layer P.

The second layer P2 may partially cover the first layer P. At least a portion of the first layer P1 may be exposed from the second layer P2. Here, the second layer P2 may be patterned simultaneously with the second layer 22-1 of the sensing electrode 20-2.

The first layer P1 may be exposed outward through an opening IL-OP penetrating the third insulating layer IL3-3 and the second insulating layer IL2-5. An external electronic device may be connected to the pad electrode PE-1 through the opening IL-OP penetrating the third and second insulating layers IL3-3 and IL2-5 to provide an electrical signal to the electronic apparatus EA-5.

Even though the electronic apparatuses EA-3, EA-4 and EA-5 further include the capacitor elements 30, the connection electrodes AE31 and AE32, and the pad electrodes PE and PE-1, the additional components 30, AE31, AE32, PE and PE-1 may be disposed on the same layer as the components of the thin film transistor 10-1 or the sensing electrode 20-1 or 20-2. Thus, complex circuits can be realized without increases in thickness of the electronic apparatuses EA-3, EA-4 and EA-5.

Figure 8:
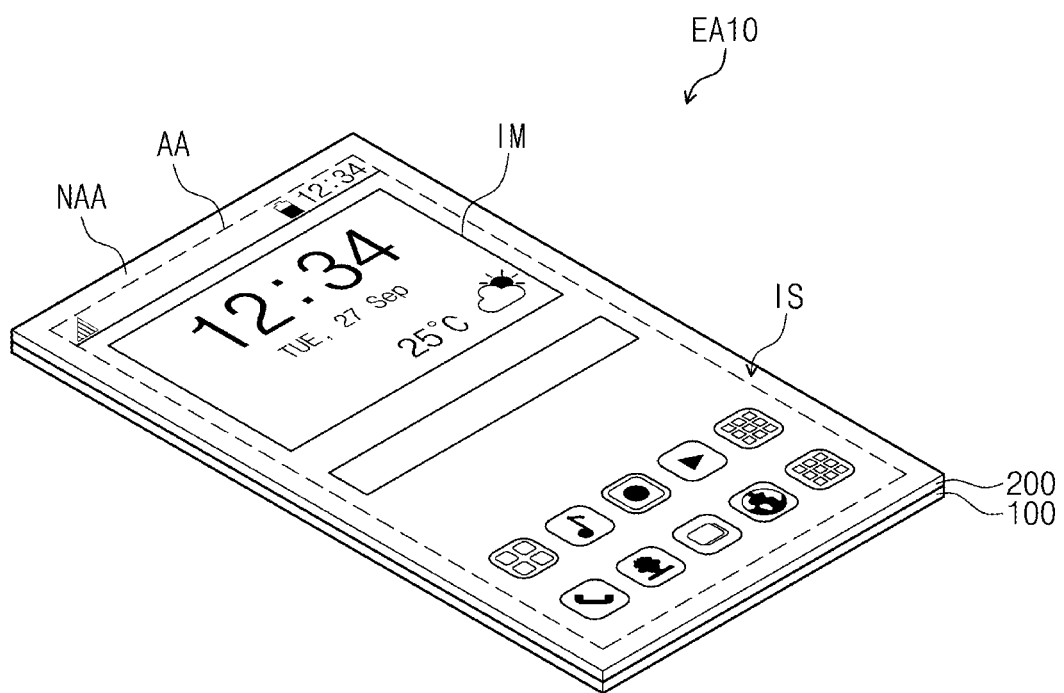
FIG. 8 is a perspective view illustrating an electronic apparatus according to an embodiment of the invention.
Figure 9A:
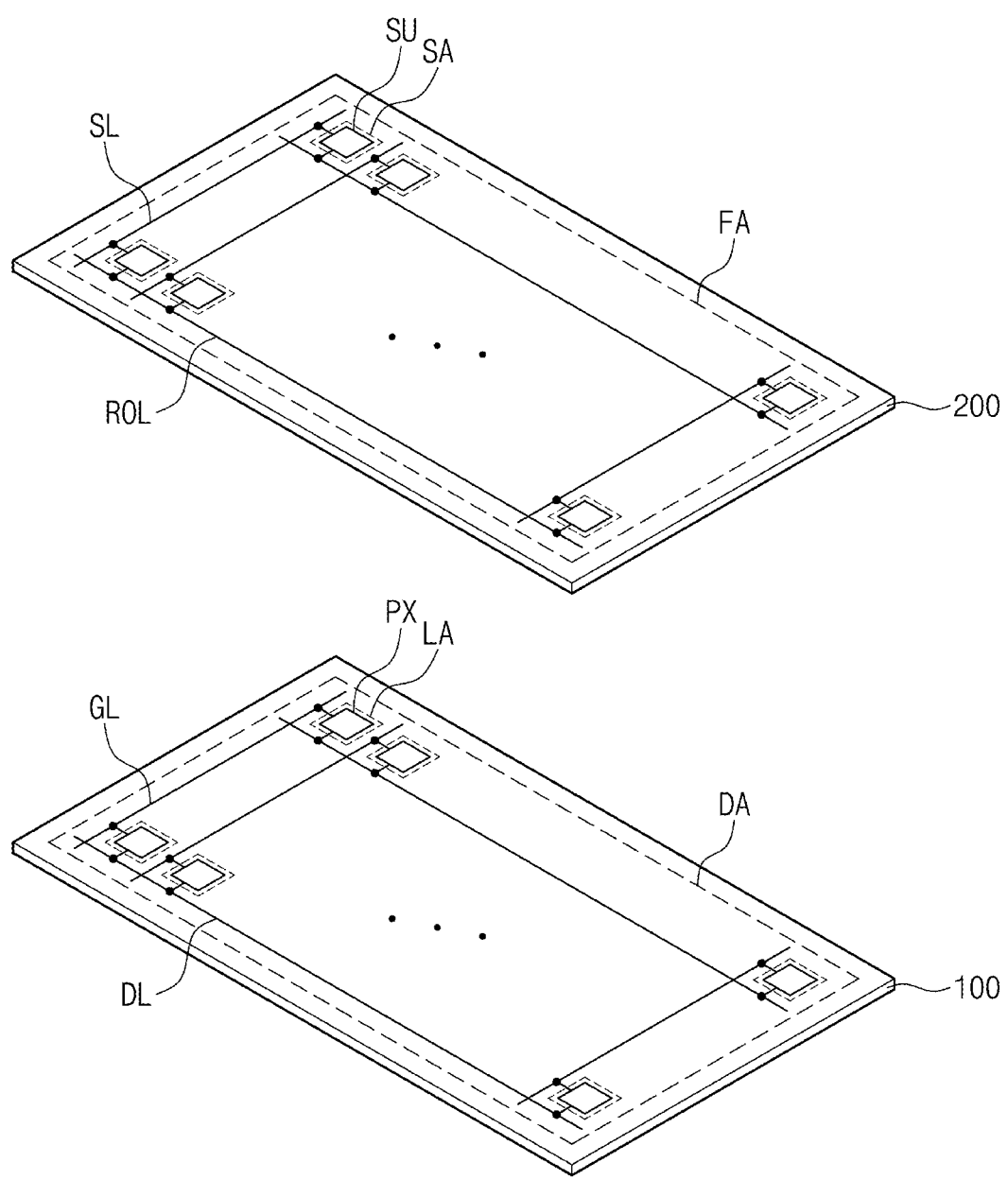
FIG. 9A is a block diagram illustrating some components of a display member illustrated in FIG. 8.
Figure 9B:
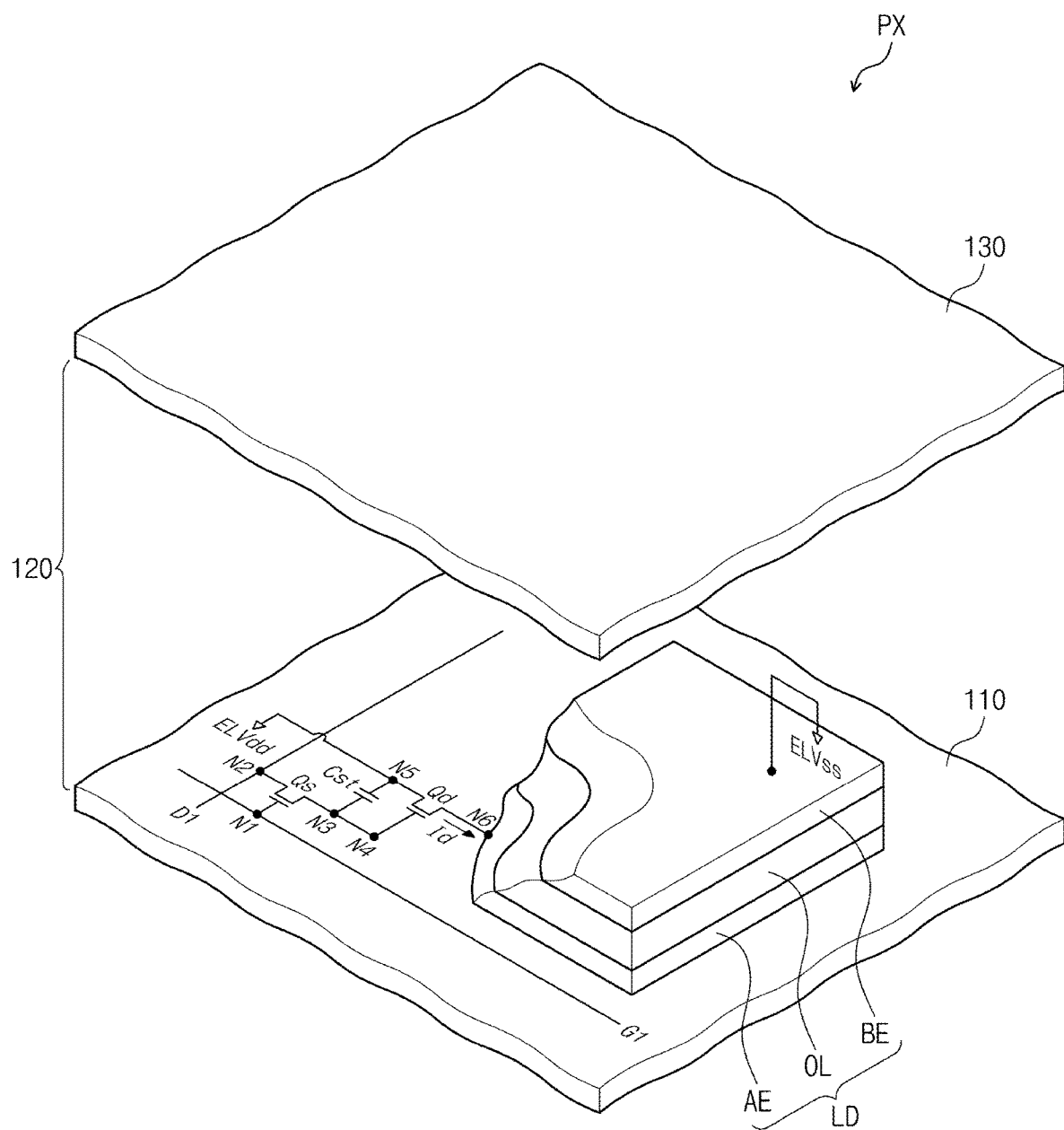
FIG. 9B is a conceptual view illustrating one pixel of FIG. 9A.

FIG. 8 is a perspective view illustrating an electronic apparatus according to an embodiment of the invention. FIG. 9A is a block diagram illustrating some components of a display member 100 illustrated in FIG. 8. FIG. 9B is a conceptual view illustrating one pixel of FIG. 9A.

As illustrated in FIG. 8, an electronic apparatus EA10 may include an active area AA and a peripheral area NAA when viewed in a plan view. The active area AA may be activated by an electrical signal and may display a predetermined image IM. In the illustrated embodiment, the electronic apparatus EA10 may be a display apparatus.

The electronic apparatus EA10 may include a display member 100 and a fingerprint sensing member 200. The display member 100 may display an image. The display member 100 may be one of various display panels such as an organic light-emitting display panel, a liquid crystal display panel, a plasma display panel, an electrophoretic display panel, and an electrowetting display panel. Hereinafter, the display member 100 which is the organic light-emitting display panel will be described as an example.

Referring to FIGS. 9A and 9B, the display member 100 includes a substrate 110, a pixel layer 120, and an encapsulation substrate 130. A plurality of pixels PX may be disposed in a display area DA of the display member 100.

The substrate 110 may be a flexible substrate or film and may be formed of a plastic with excellent heat-resistance and durability, such as polyethyleneetherphthalate, polyethylenenaphthalate, polycarbonate, polyarylate, polyetherimide, polyethersulfonate, and/or polyimide. However, embodiments of the invention are not limited thereto. In other embodiments, the substrate 110 may be formed of at least one of other various materials such as a metal and a glass.

A barrier layer (not shown) may be disposed between the substrate 110 and the pixel layer 120. The barrier layer may prevent an external foreign material (e.g., water and/or oxygen) from permeating into an organic light-emitting element LD through the substrate 110.

The pixel layer 120 may be disposed between the substrate 110 and the encapsulation substrate 130. The pixel layer 120 includes a plurality of gate lines GL, a plurality of data lines DL, and a plurality of pixels PX. The gate lines GL may be insulated from the data lines DL and may intersect the data lines DL.

In FIG. 9A, the gate lines GL may extend in one direction, and the data lines DL may extend in another direction intersecting the gate lines GL. However, embodiments of the invention are not limited thereto. In other embodiments, at least a portion of each of the gate lines GL and the data lines DL may have a bent shape, not a straight line shape, under the conditions that the gate lines GL and the data lines DL are insulated from each other and intersect each other.

The pixels PX may be provided in light-emitting areas LA, respectively. Each of the pixels PX may be connected to a corresponding one of the gate lines GL and a corresponding one of the data lines DL to display an image.

Each of the pixels PX may display one of a red color, a green color, and a blue color. However, embodiments of the invention are not limited thereto. In certain embodiments, each of the pixels PX may display another color (e.g., a white color) except the red color, the green color, and the blue color. The pixels PX having quadrilateral shapes are illustrated as an example in FIG. 9A. However, embodiments of the invention are not limited thereto. In other embodiments, each of the pixels PX may have one of other various shapes such as a polygonal shape, a circular shape, and an elliptical shape.

In FIG. 9B, one pixel PX connected to a first gate line G1 and a first data line D1 is illustrated as an example. Referring to FIG. 9B, the pixel PX includes a switching transistor Qs, a driving transistor Qd, a storage capacitor Cst, and an organic light-emitting element LD.

The display area DA may include light-emitting areas LA, each of which overlaps with the organic light-emitting element LD of the pixel PX, and a non-light-emitting area NLA not overlapping with the organic light-emitting element LD. The light-emitting areas LA may be areas which substantially display light, and the non-light-emitting area NLA may be an area which is covered by a light-shielding member and does not display light.

The switching transistor Qs may include a control terminal N1, an input terminal N2, and an output terminal N3. The control terminal N1 is connected to the first gate line G1, the input terminal N2 is connected to the first data line D1, and the output terminal N3 is connected to the driving transistor Qd. The switching transistor Qs outputs a data voltage provided from the first data line D1 to the driving transistor Qd in response to a gate signal provided from the first gate line G1.

The driving transistor Qd may include a control terminal N4, an input terminal N5, and an output terminal N6. The control terminal N4 is connected to the output terminal N3 of the switching transistor Qs, the input terminal N5 receives a driving voltage ELVdd, and the output terminal N6 is connected to the organic light-emitting element LD. The driving transistor Qd outputs an output current Id to the organic light-emitting element LD. A magnitude of the output current Id of the driving transistor Qd may be changed depending on a voltage formed between the control terminal N4 and the output terminal N6 of the driving transistor Qd.

The storage capacitor Cst may be connected between the output terminal N3 of the switching transistor Qs and the input terminal N5 of the driving transistor Qd. The storage capacitor Cst stores the data voltage applied to the control terminal N4 of the driving transistor Qd and retains the stored data voltage for a certain time after the switching transistor Qs is turned-off.

The pixel layer 120 may further include a driving voltage line (not shown). The driving voltage line may extend in parallel to the first gate line G1 or the first data line D1. The driving voltage line may receive the driving voltage ELVdd and may be connected to the input terminal N5 of the driving transistor Qd.

The organic light-emitting element LD may include a first electrode AE, an organic layer OL, and a second electrode BE.

The first electrode AE may be an anode or a positive electrode. The first electrode AE is connected to the output terminal N6 of the driving transistor Qd to generate holes. The second electrode BE may be a cathode or a negative electrode. The second electrode BE receives a common voltage ELVss and generates electrons. The organic layer OL may be disposed between the first electrode AE and the second electrode BE. The organic layer OL may consist of a plurality of layers and may include an organic material.

Holes and electrons may be injected into an organic light-emitting layer (not shown) disposed in the organic layer OL from the first electrode AE and the second electrode BE, respectively. In the organic light-emitting layer, the holes and the electrons may be combined with each other to form excitons and light may be emitted by transition of the excitons from an excited state to a base state. An intensity of the light emitted from the organic light-emitting layer may be determined by the output current Id flowing through the output terminal N6 of the driving transistor Qd.

In some embodiments, the organic layer OL may include two or more organic light-emitting layers generating lights of which colors are different from each other. Meanwhile, in FIG. 9B, the second electrode BE is disposed on the first electrode AE. However, embodiments of the invention are not limited thereto. In another embodiment, the positions of the first and second electrodes AE and BE may be changed with each other.

The encapsulation substrate 130 may be disposed on the pixel layer 120. The encapsulation substrate 130 may cover the display area DA. The encapsulation substrate 130 may include at least one of an organic layer or an inorganic layer. However, embodiments of the invention are not limited thereto. In other embodiments, the encapsulation substrate 130 may be a substrate formed of glass or plastic.

Referring again to FIG. 9A, a plurality of unit sensors SU may be provided to correspond to the plurality of pixels PX. The plurality of unit sensors SU may be disposed in a plurality of sensing areas SA, respectively. The plurality of sensing areas SA may overlap with the plurality of light-emitting areas LA when viewed in a plan view.

As described above, the sensing electrode 20-1 may be formed as a transparent electrode, and only the first layer 21 (see FIG. 5) which is transparent may remain in the sensing area SA. Thus, even though the light-emitting area LA overlaps with the sensing area SA in the electronic apparatus EA10, it is possible to prevent the image IM from being distorted or deteriorated by the sensing electrode 20-1.

The plurality of unit sensors SU may correspond to the unit sensors SU illustrated in FIG. 2A. The electronic apparatus EA10 according to an embodiment of the invention may provide a total sensing area TA of which an area corresponds to that of the display area DA.

The active area AA of the electronic apparatus EA10 may include the display area DA and the total sensing area TA. Thus, a user may receive information through the image IM provided in the active area AA of the electronic apparatus EA10 and may provide an input (e.g., a fingerprint) to the active area AA to provide user's information to the electronic apparatus EA10.

Figure 10:
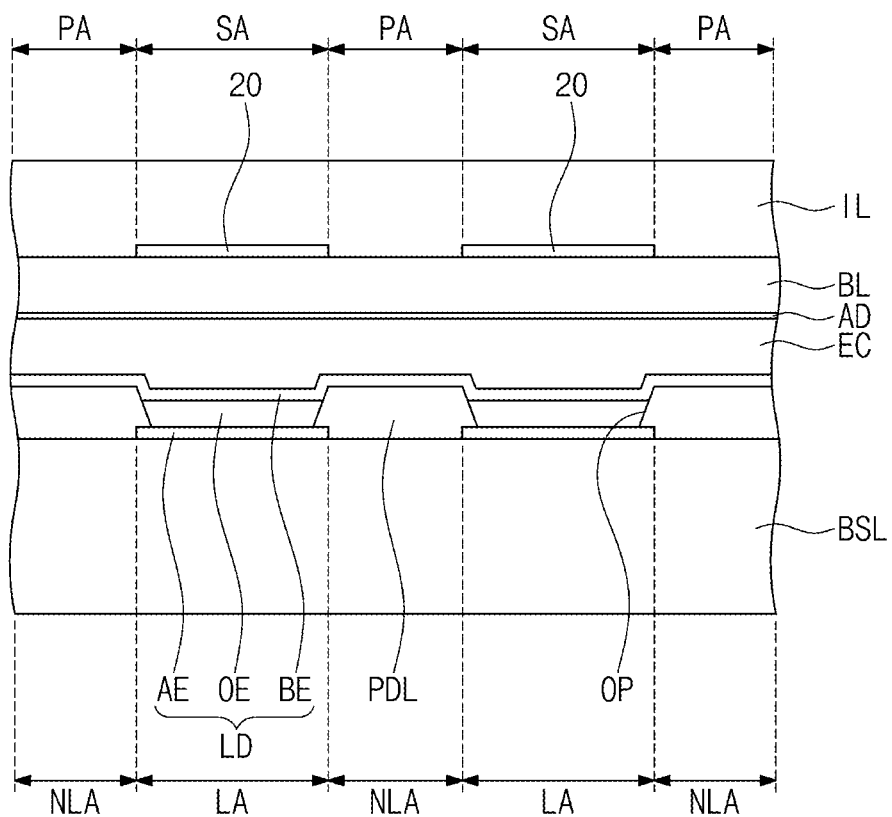
FIG. 10 is a cross-sectional view schematically illustrating a portion of the electronic apparatus of FIG. 8.

FIG. 10 is a cross-sectional view schematically illustrating a portion of the electronic apparatus of FIG. 8. For the purpose of ease and convenience in description and illustration, some components are omitted in FIG. 10. Hereinafter, an electronic apparatus EA10 according to an embodiment of the invention will be described with reference to FIG. 10. In addition, the same components as described with reference to FIGS. 1 to 9B will indicated by the same reference numerals or designators, and the descriptions thereto will omitted for the purpose of ease and convenience in description and illustration.

Referring to FIG. 10, the electronic apparatus EA10 may further include an adhesive layer AD coupling the display member 100 and the fingerprint sensing member 200 to each other. However, embodiments of the invention are not limited thereto. In another embodiment, the adhesive layer AD may be omitted from the electronic apparatus EA10.

As described above, the display member 100 may include the light-emitting areas LA and the non-light-emitting area NLA. Each of the light-emitting areas LA may be an area in which light is displayed by the organic light-emitting element LD (see FIG. 9B). In FIG. 10, the light-emitting area LA corresponds to the first electrode AE.

As described above, the fingerprint sensing member 200 may include the sensing areas SA and the element area PA. Each of the sensing areas SA may be an area which forms a capacitor with the sensing electrode 20. In FIG. 10, the sensing area SA corresponds to the sensing electrode 20.

In FIG. 10, the sensing electrode 20 is disposed on the base layer BL. The base layer BL may correspond to the base layer BS illustrated in FIG. 4.

However, embodiments of the invention are not limited thereto. In another embodiment, the sensing electrode 20 may be disposed directly on the display member 100. For example, the sensing electrode 20 may be disposed directly on an encapsulation substrate EC of the display member 100. In this case, the base layer BS illustrated in FIG. 2B may correspond to the display member 100. The encapsulation substrate EC of the display member 100 may correspond to the encapsulation substrate 130 of FIG. 9B. The electronic apparatus EA10 according to the invention may be provided in various forms and may not be limited to a specific embodiment.

As illustrated in FIG. 10, the sensing areas SA may correspond to the light-emitting areas LA in the electronic apparatus EA10. Thus, the sensing areas SA may overlap with the light-emitting areas LA when viewed in a plan view. As a result, the electronic apparatus EA10 may easily sense a fingerprint of a user through an entire surface of the area in which an image is displayed.

Figure 11A:
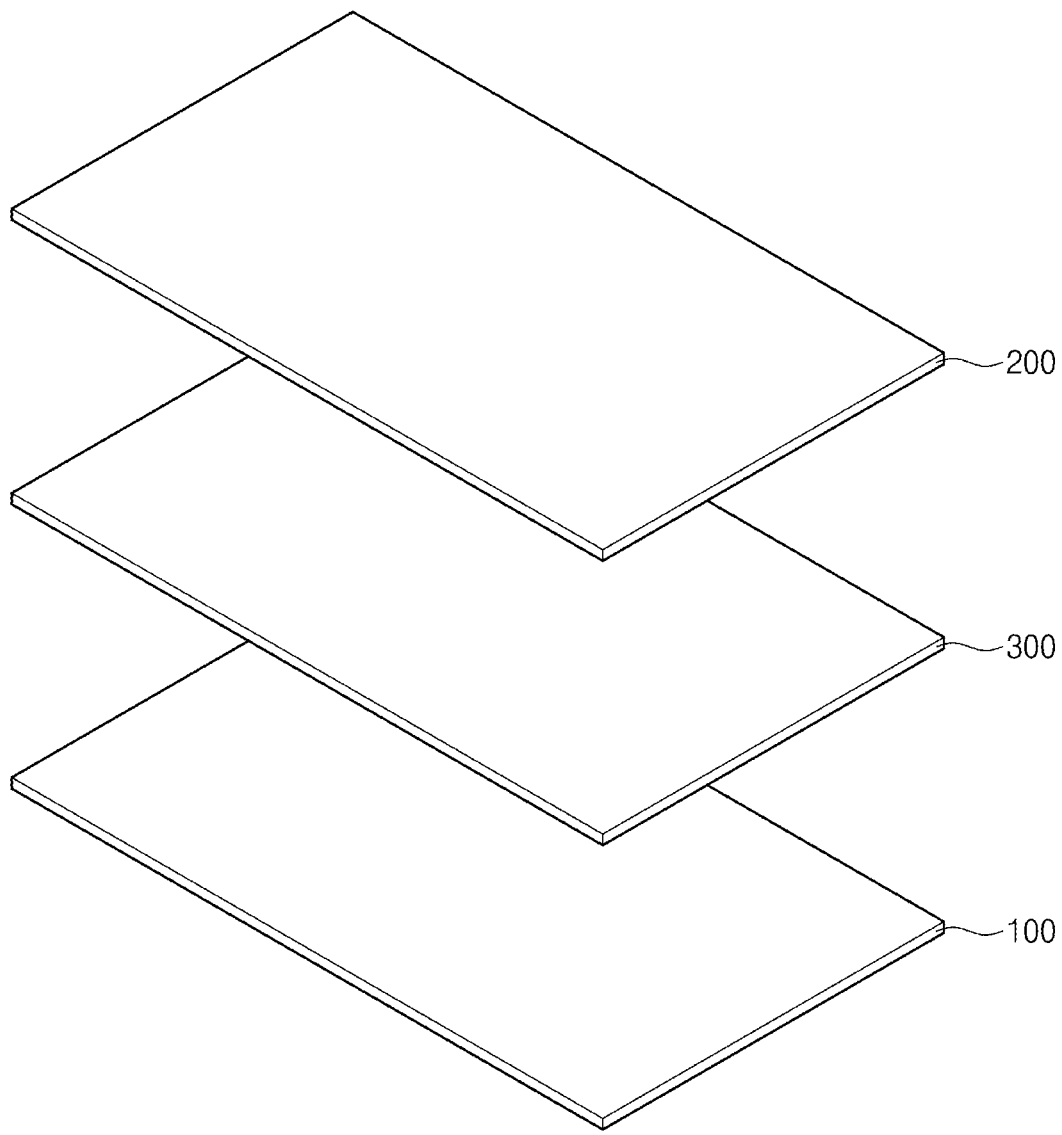
FIGS. 11A and 11B are exploded perspective views illustrating electronic apparatuses according to some embodiments of the invention.
Figure 11B:
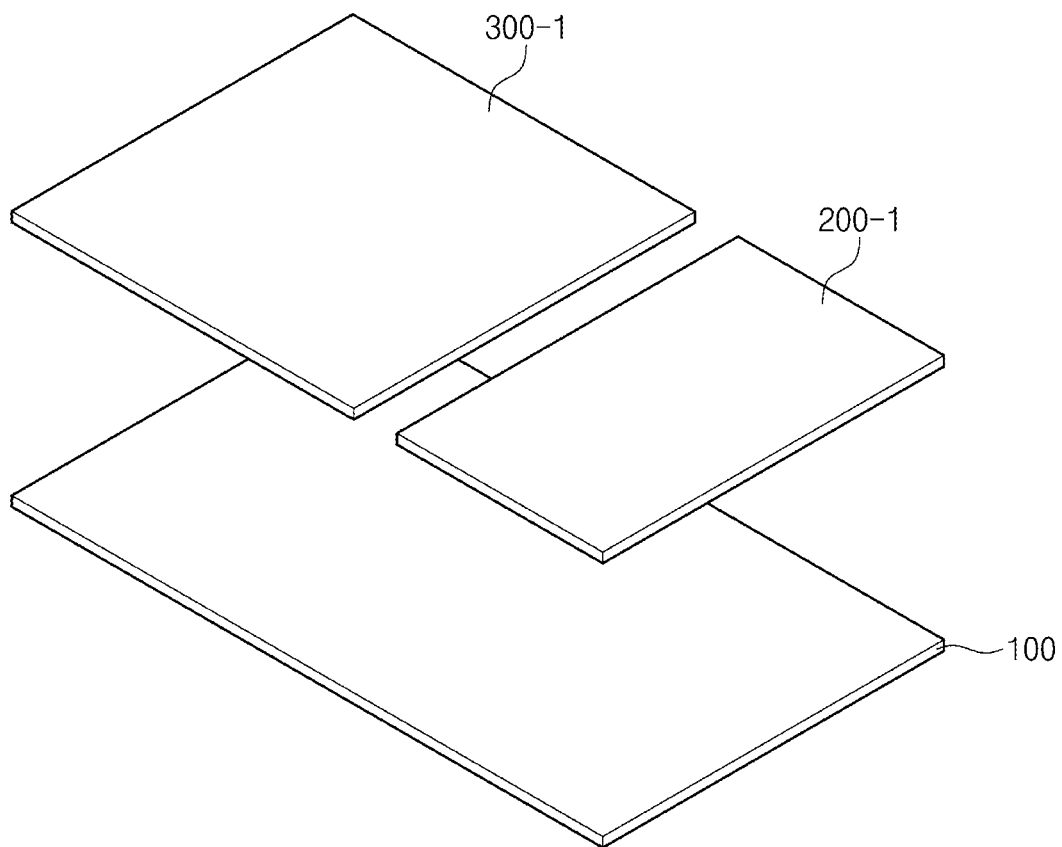

FIGS. 11A and 11B are exploded perspective views illustrating electronic apparatuses according to some embodiments of the invention. Hereinafter, electronic apparatuses EA20 and EA30 according to some embodiments of the invention will be described with reference to FIGS. 11A and 11B. In addition, the same components as described with reference to FIGS. 1 to 10 will be indicated by the same reference numerals or designators, and the descriptions thereto will be omitted for the purpose of ease and convenience in description and illustration.

Referring to FIG. 11A, the electronic apparatus EA20 may further include an input sensing member 300. The input sensing member 300 senses an input provided from the outside. The input provided from the outside may be a proximity touch, a contact touch, and pressure. In the electronic apparatus EA20 according to an embodiment of the invention, both the touch sensing area and the fingerprint sensing area may be provided in the area in which an image is displayed, and thus convenience of a user can be improved.

Referring to FIG. 11B, the electronic apparatus EA30 may include a fingerprint sensing member 200-1 and an input sensing member 300-1 that are provided on the same plane. The fingerprint sensing member 200-1 and the input sensing member 300-1 may be provided on different areas of the display member 100.

The electronic apparatus EA20 according to an embodiment of the invention may be divided into the touch sensing area and the fingerprint sensing area separated from each other. In the illustrated embodiment, the touch sensing area may not overlap with the fingerprint sensing area. In the electronic apparatus EA30, the fingerprint sensing area may be selectively provided to an area necessary for sensing a fingerprint and the touch sensing area may be provided to a remaining area. As a result, both the touch sensing area and the fingerprint sensing area may be provided to the electronic apparatus EA30 without an increase in thickness of the electronic apparatus EA30.

FIGS. 12A to 12E are cross-sectional views illustrating a method of manufacturing an electronic apparatus, according to an embodiment of the invention. FIGS. 12A to 12E illustrate a method of manufacturing the electronic apparatus EA-3 illustrated in FIG. 7A. Hereinafter, the method of manufacturing the electronic apparatus EA-3 will be described with reference to FIGS. 12A to 12E.

Figure 12A:
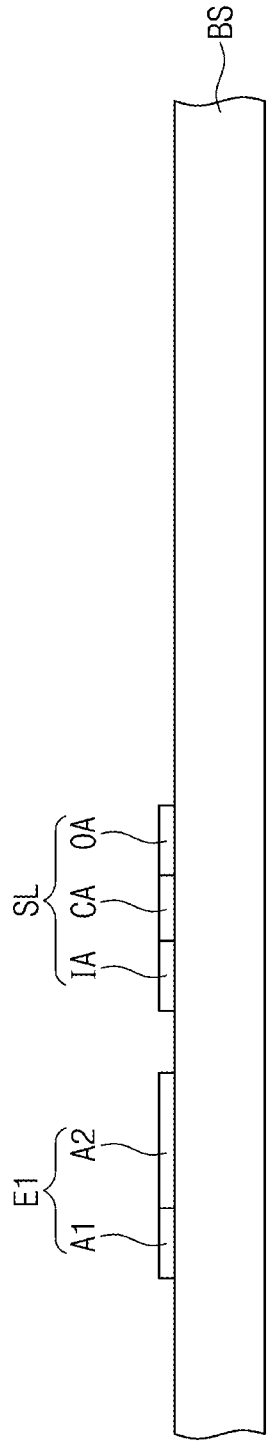
FIGS. 12A, 12B, 12C, 12D, and 12E are cross-sectional views illustrating a method of manufacturing an electronic apparatus, according to an embodiment of the invention.

Referring to FIG. 12A, first patterns are formed on a base layer BS. The first patterns may be formed of a semiconductor material. The first patterns may include a first electrode E1 and a semiconductor pattern SL.

The first electrode E1 and the semiconductor pattern SL may be formed by patterning the same semiconductor material layer using a single mask. Thus, the first electrode E1 and the semiconductor pattern SL may be formed at the same time in the same process.

Figure 12B:
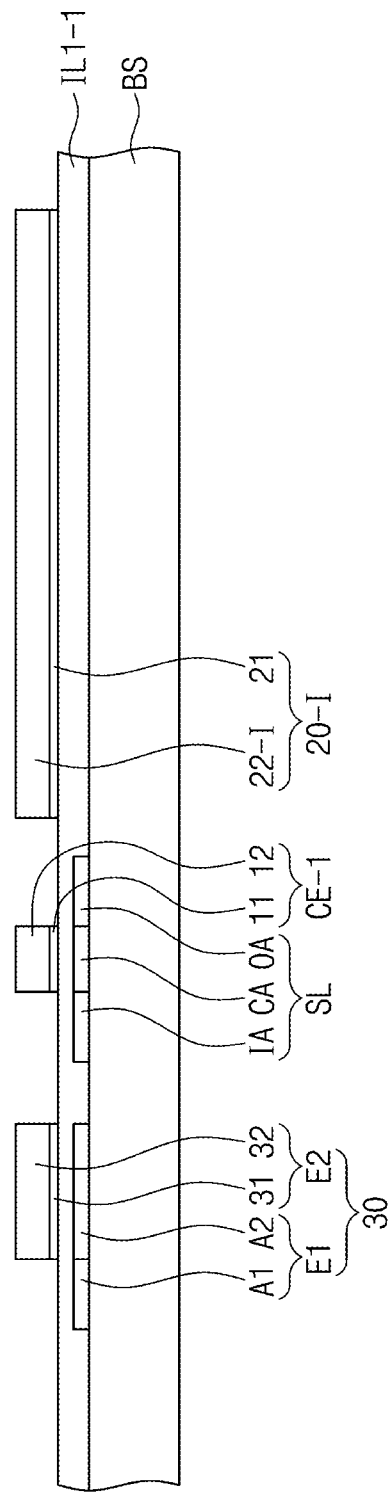

Thereafter, as illustrated in FIG. 12B, a first insulating layer IL1-1 may be formed on the base layer BS and the first patterns, and then, second patterns may be formed on the first insulating layer IL1-1. The second patterns may be formed of a conductive material. In the illustrated embodiment, each of the second patterns may have a stack structure including a first layer and a second layer. The first layer may be optically transparent and may have conductivity, and the second layer may be disposed on the first layer and may have a conductivity higher than that of the first layer.

The second patterns may include a second electrode E2, a control electrode CE-1, and an initial sensing electrode 20-I. The second electrode E2, the control electrode CE-1 and the initial sensing electrode 20-I may be formed by patterning the same conductive material layer using a single mask. Thus, the second electrode E2, the control electrode CE-1 and the initial sensing electrode 20-I may be formed at the same time in the same process.

Here, each of the second electrode E2, the control electrode CE-1 and the initial sensing electrode 20-I may have the stack structure. In more detail, the control electrode CE-1 may have a stack structure which includes a first layer 11 being optically transparent and a second layer 12 having a high conductivity. The initial sensing electrode 20-I may have a stack structure which includes a first layer 21 being optically transparent and a second layer 22-I having a high conductivity. The second electrode E2 may have a stack structure which includes a first layer 31 being optically transparent and a second layer 32 having a high conductivity.

Figure 12C:
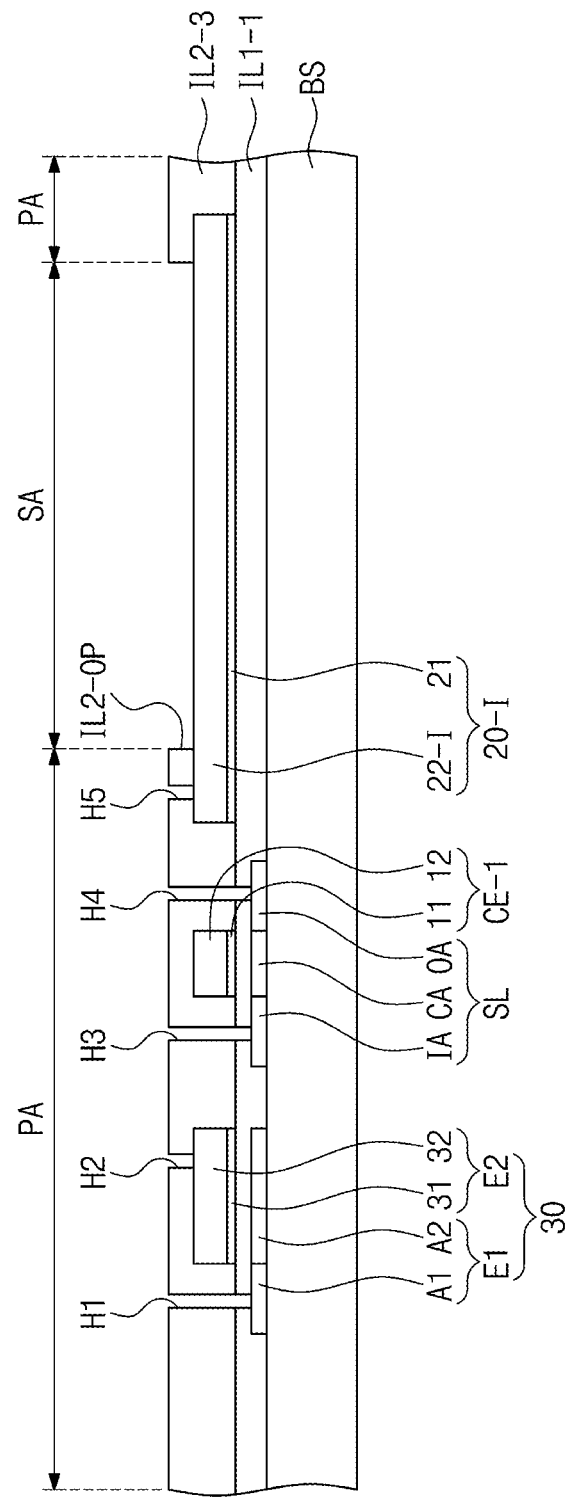

Subsequently, as illustrated in FIG. 12C, a second insulating layer IL2-3 may be formed. In some embodiments, an insulating layer may be formed to cover the second electrode E2, the control electrode CE-1, and the initial sensing electrode 20-I, and then, predetermined holes may be formed in the insulating layer to form the second insulating layer IL2-3.

At this time, first to fifth holes H1, H2, H3, H4 and H5 and an opening IL2-OP may be formed. The first hole H1 may penetrate the first and second insulating layers IL1-1 and IL2-3 to expose the first electrode E1, and the second hole H2 may penetrate the second insulating layer IL2-3 to expose the second electrode E2. The third hole H3 may penetrate the first and second insulating layers IL1-1 and IL2-3 to expose a portion of the semiconductor pattern SL, and the fourth hole H4 may penetrate the first and second insulating layers IL1-1 and IL2-3 to expose another portion of the semiconductor pattern SL. The fifth hole H5 may penetrate the second insulating layer IL2-3 to expose a portion of the initial sensing electrode 20-I, and the opening IL2-OP may penetrate the second insulating layer IL2-3 to expose another portion of the initial sensing electrode 20-I.

The opening IL2-OP may be wider than the fifth hole H5. The opening IL2-OP may be an area corresponding to a sensing area SA to be described later.

Figure 12D:
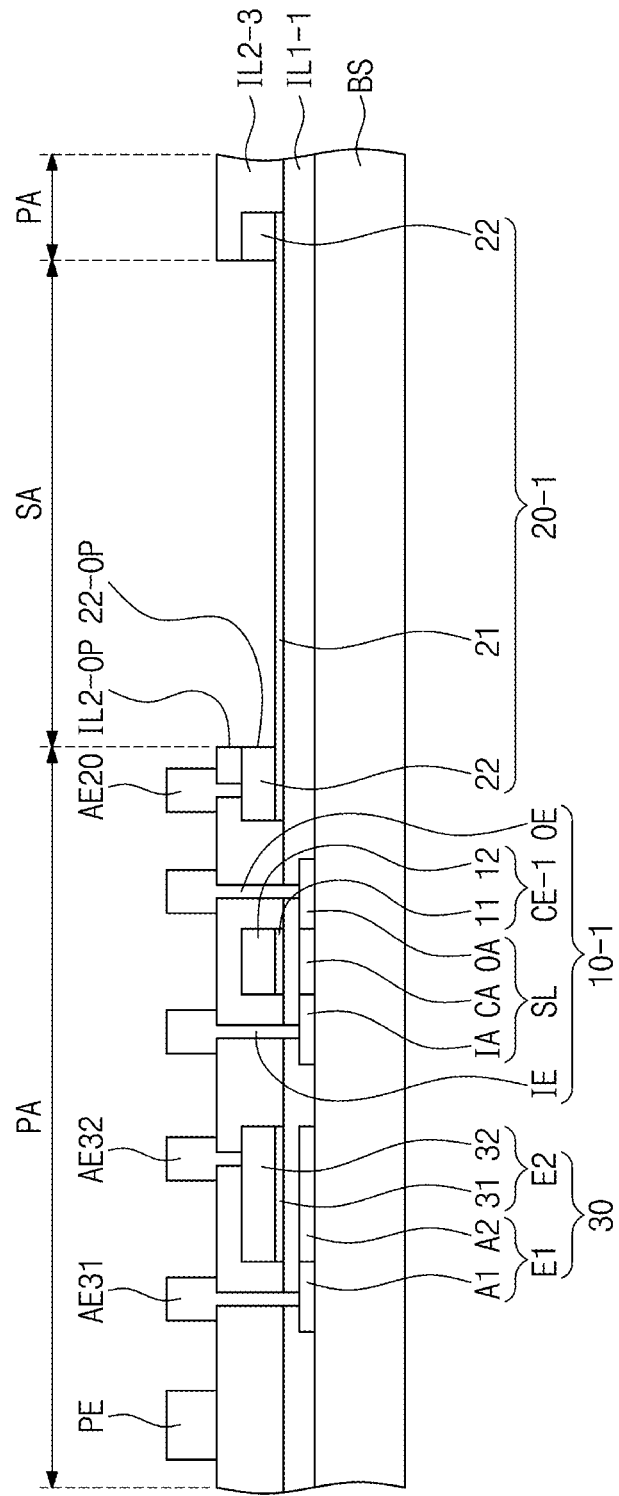

Thereafter, as illustrated in FIG. 12D, third patterns and a sensing electrode 20-1 may be formed. The third patterns may be formed of a conductive material. The third patterns may include an input electrode IE, an output electrode OE, connection electrodes AE20, AE31 and AE32, and a pad electrode PE.

The input electrode IE, the output electrode OE, the connection electrodes AE20, AE31 and AE32 and the pad electrode PE may be formed by patterning the same conductive material layer using a single mask. Thus, the input electrode IE, the output electrode OE, the connection electrodes AE20, AE31 and AE32 and the pad electrode PE may be formed at the same time in the same process.

The sensing electrode 20-1 may be formed by removing at least a portion of the initial sensing electrode 20-I. A portion of the initial sensing electrode 20-I exposed by the opening IL2-OP may be removed in the patterning process for forming the input electrode IE. At this time, the second layer 22-I of the initial sensing electrode 20-I exposed by the opening IL2-OP may be removed but the first layer 21 may remain to be exposed outward.

The second layer 22 may be removed using the second insulating layer IL2-3 having the opening the IL2-OP as a mask. Thus, the opening IL2-OP may overlap with an opening 22-OP formed in the second layer 22 when viewed in a plan view. In addition, an inner side surface of the opening 22-OP of the second layer 22 may be aligned with an inner side surface of the opening IL2-OP of the second insulating layer IL2-3 when viewed in a cross-sectional view.

Figure 12E:
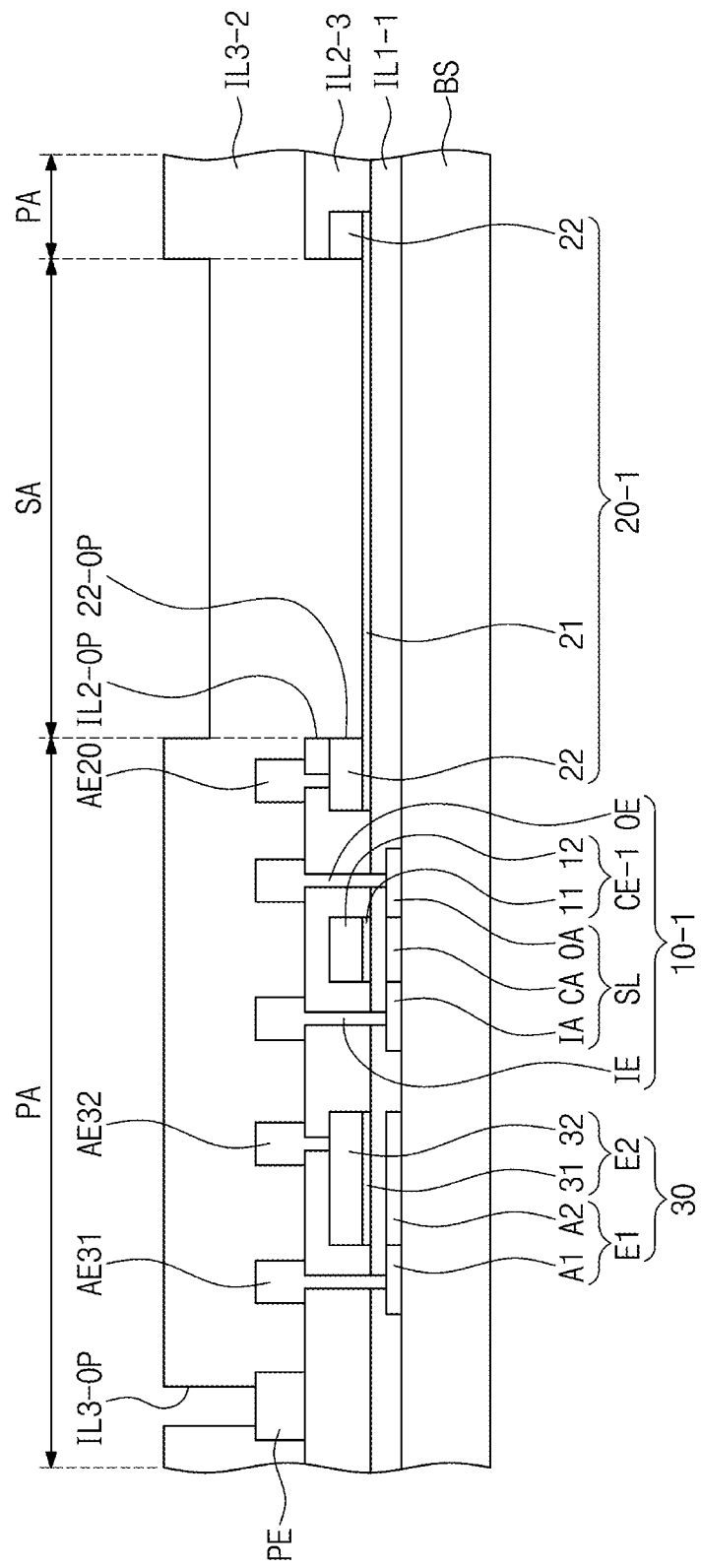

Subsequently, as illustrated in FIG. 12E, a third insulating layer IL3-2 is formed on the third patterns. In some embodiments, an insulating material may be deposited to cover the third patterns, and then, an opening exposing at least a portion of the pad electrode PE may be formed in the insulating material, thereby forming the third insulating layer IL3-2.

Meanwhile, a portion of the third insulating layer IL3-2, which corresponds to the sensing area SA, may have a recessed top surface. The recessed top surface may be a shape reflecting the shape of the sensing electrode 20-1. However, embodiments of the invention are not limited thereto. In another embodiment, the top surface of the third insulating layer IL3-2 may be a flat surface.

In the method of manufacturing the electronic apparatus according to the embodiment of the invention, the thin film transistor 10-1 and/or the capacitor element 30 for driving the sensing electrode 20-1 may be formed by the same process as the sensing electrode 20-1. Thus, the manufacturing processes can be simplified and a process cost can be reduced. As a result, the active matrix type sensing member including complex elements may be formed through the simplified processes.

FIGS. 13A to 13E are cross-sectional views illustrating a method of manufacturing an electronic apparatus, according to an embodiment of the invention. FIGS. 13A to 13E illustrate a method of manufacturing the electronic apparatus EA-5 illustrated in FIG. 7C. Hereinafter, the method of manufacturing the electronic apparatus EA-5 will be described with reference to FIGS. 13A to 13E. In addition, the descriptions to the same components as in the embodiment of FIGS. 12A to 12E will be omitted or mentioned briefly for the purpose of ease and convenience in description.

As illustrated in FIG. 13A, the first insulating layer IL1-1 may be formed after the formation of the first electrode E1 and the semiconductor pattern SL, and then, second patterns may be formed on the first insulating layer IL1-1. The second patterns may include an initial pad pattern PE-1, the second electrode E2, the control electrode CE-1, and the initial sensing electrode 20-I. Meanwhile, processes of FIG. 13A may substantially correspond to the processes of FIG. 12B, and thus detailed descriptions thereto are omitted.

Subsequently, as illustrated in FIG. 13B, at least a portion of the second patterns may be etched to form a pad electrode PE-1 and a sensing electrode 20-2. At this time, at least a portion of a second layer P2 of the initial pad electrode PE-1 may be etched, and at least a portion of a first layer P1 of the initial pad electrode PE-1 may be exposed from the second layer P2.

The sensing electrode 20-2 may be formed by etching at least a portion of the second layer 22-I of the initial sensing electrode 20-I. In the illustrated embodiment, the sensing electrode 20-2 and the pad electrode PE-1 may be formed at the same time by the same patterning process. Thus, an additional process for forming the pad electrode PE-1 and the sensing electrode 20-2 can be omitted to simplify manufacturing processes.

Figure 13C:
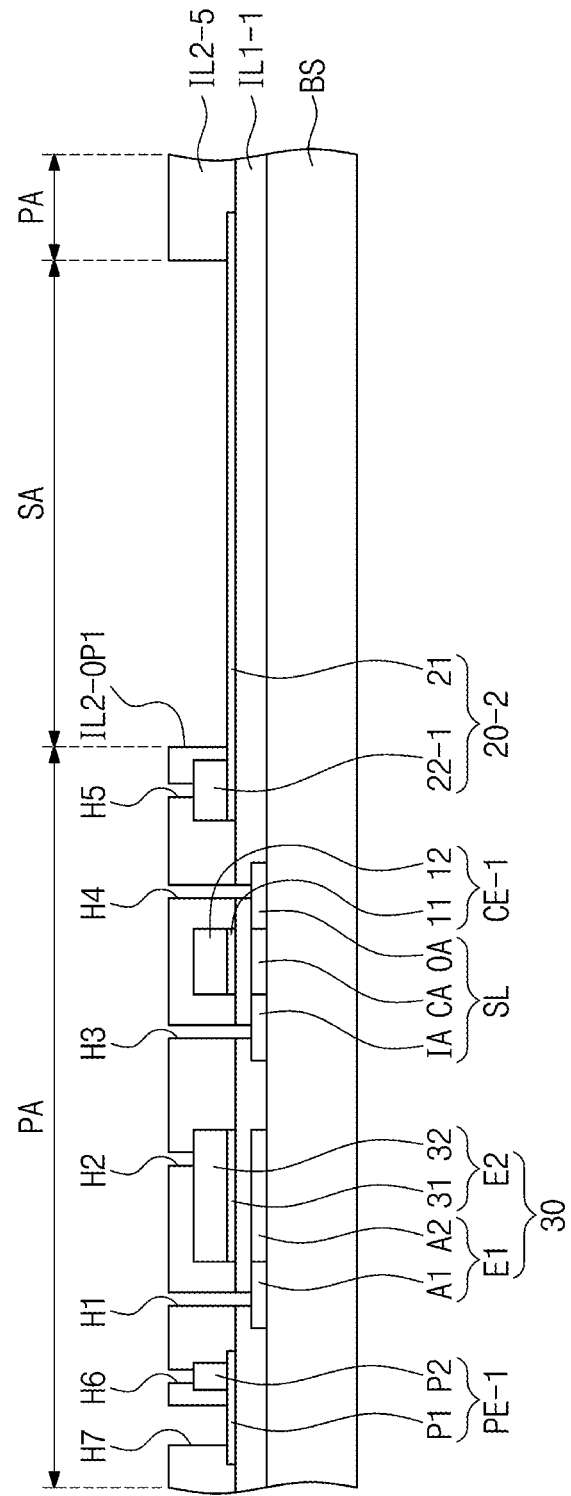

Thereafter, as illustrated in FIG. 13C, a second insulating layer IL2-5 may be formed on the second patterns. The second insulating layer IL2-5 may be formed by forming a plurality of holes in an insulating material layer covering the second patterns.

Holes H6 and H7 exposing the pad electrode PE-1 may be additionally formed in the second insulating layer IL2-5. A sixth hole H6 may expose the second layer P2 of the pad electrode PE-1, and a seventh hole H7 may expose the first layer P1 of the pad electrode PE-1.

Meanwhile, the formation of the second insulating layer IL2-5 may be performed after the formation of the sensing electrode 20-2. Thus, the second insulating layer IL2-5 may cover a top surface and side surfaces of the second layer 22-1 of the sensing electrode 20-2.

Figure 13D:
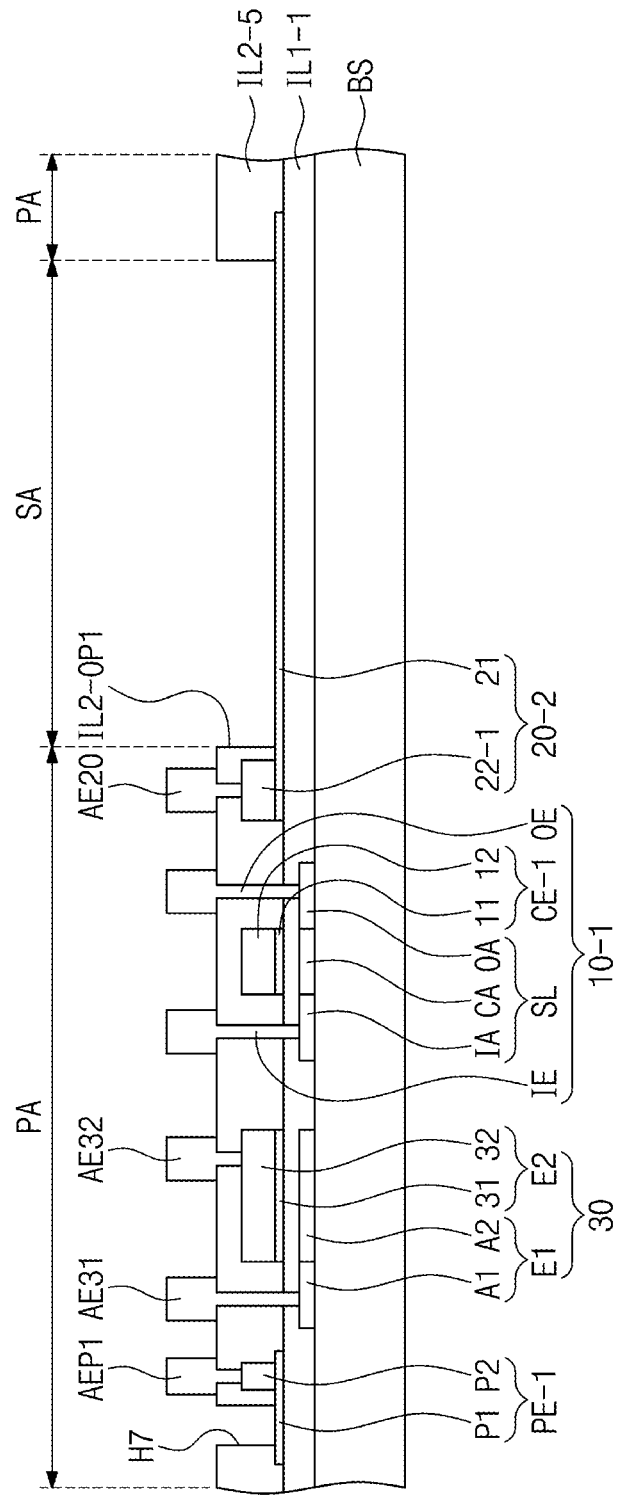

Subsequently, as illustrated in FIG. 13D, third patterns including an input electrode IE, an output electrode OE and connection electrodes are formed on the second insulating layer IL2-5. A conductive material layer may be formed, and then, a patterning process may be performed using a single mask on the conductive material layer to form the third patterns.

At this time, a connection electrode AEP1 connected to the pad electrode PE-1 may also be formed. The connection electrode AEP1 is connected to the pad electrode PE-1 through the sixth hole H6.

Figure 13E:
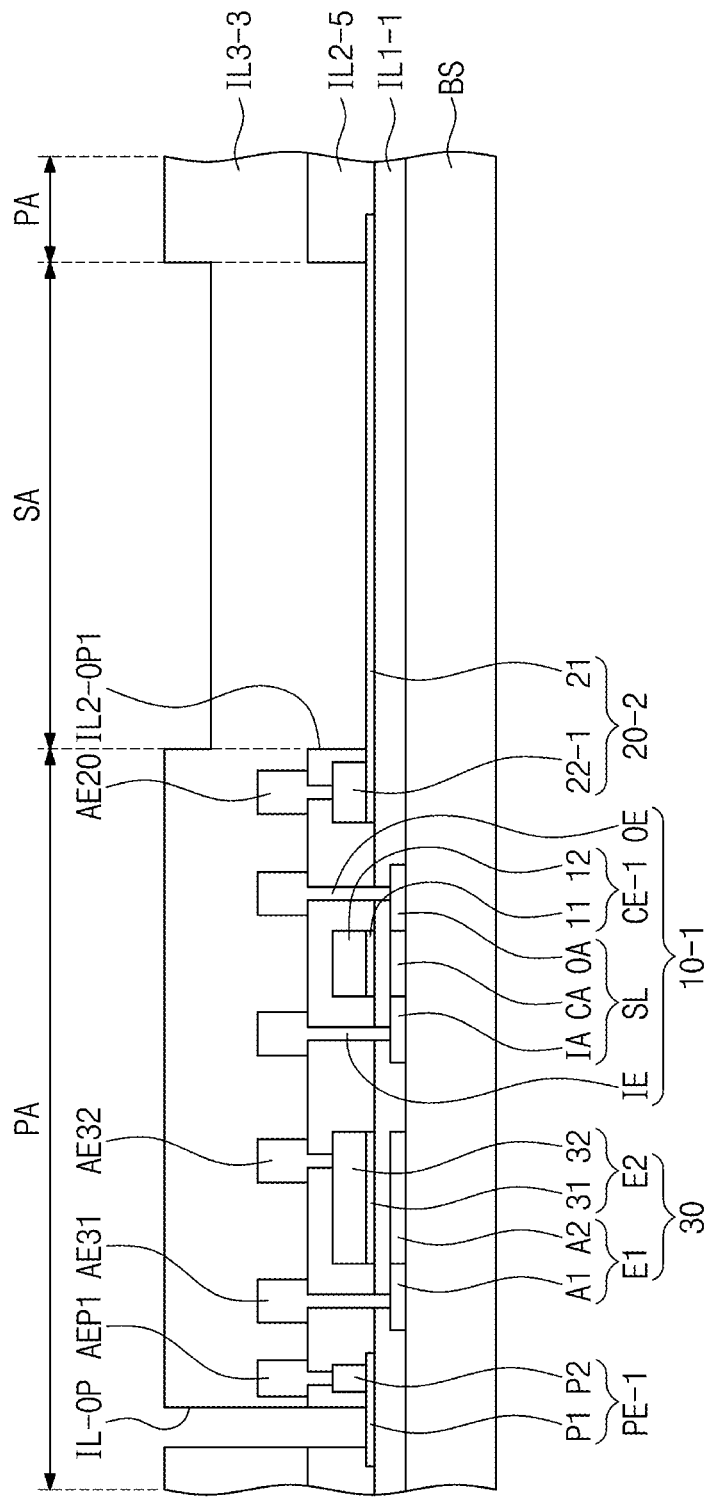

Subsequently, as illustrated in FIG. 13E, a third insulating layer IL3-3 may be formed. An insulating material layer may be formed to cover the third patterns, and then, an opening IL-OP may be formed in the insulating material layer, thereby forming the third insulating layer IL3-3.

The opening IL-OP may be formed to overlap with the seventh hole H7. The first layer P1 of the pad electrode PE-1 may be exposed outward through the opening IL-OP.

In the method of manufacturing the electronic apparatus EA-5 according to the embodiment of the invention, the pad electrode PE-1 may be formed in the process of forming the control electrode CE-1 and the sensing electrode 20-2. Thus, the pad electrode PE-1 may be disposed on the same layer as the control electrode CE-1, the sensing electrode 20-2, and the second electrode E2. In the method of manufacturing the electronic apparatus EA-5 according to the embodiment of the invention, the pad electrode PE-1 may be formed together with other components, and thus the pad electrode PE-1 may be formed without an additional process. As a result, a manufacture cost of the electronic apparatus can be reduced and the manufacturing processes of the electronic apparatus can be simplified.

According to some embodiments of the invention, the sensing electrode and the thin film transistor for controlling the sensing electrode may be formed in the same process. Thus, the sensing electrode and driving elements for driving the sensing electrode may be formed through a single process and may be formed using a single mask at the same time. As a result, the process cost of the display apparatus can be reduced and the manufacturing processes of the display apparatus can be simplified.

In addition, the sensing electrode may be disposed on the same layer as one component of the thin film transistor. Thus, even though the driving elements for driving the sensing electrode have a complex structure, it is possible to inhibit or prevent an increase in thickness of the display apparatus.

Although certain embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A method of manufacturing a display apparatus, the method comprising:
   forming first patterns of a semiconductor material on a base layer;

forming a first insulating layer covering the first patterns;
forming second patterns of a conductive material on the first insulating layer;
removing at least a portion of at least one of the second patterns; and
forming a second insulating layer on the second patterns,
wherein each of the second patterns comprises: a first layer; and a second layer disposed on the first layer,
wherein the first patterns comprise a semiconductor pattern,
wherein the second patterns comprise: a control electrode pattern overlapping with the semiconductor pattern in a plan view; and a sensing electrode pattern,
wherein the second layer of the control electrode pattern fully covers the first layer of the control electrode pattern, and
wherein the second layer of the sensing electrode pattern is partially removed in the removing of the at least a portion to partially cover the first layer of the sensing electrode pattern.

2. The method of claim 1, wherein the forming the second insulating layer comprises:

forming an insulating material layer covering the second patterns; and forming an opening exposing at least a portion of the sensing electrode pattern in the insulating material layer to form the second insulating layer, wherein a portion of the second layer of the sensing electrode pattern is removed, and the portion of the second layer of the sensing electrode pattern corresponds to the opening of the second insulating layer.

3. The method of claim 1, wherein the forming the second insulating layer comprises:

forming an insulating material layer covering the second patterns; and forming an opening exposing at least a portion of the sensing electrode pattern in the insulating material layer to form the second insulating layer, wherein the forming of the opening is performed after the portion of the second layer of the sensing electrode pattern is removed.

* * * * *